United States Patent
Han et al.

(10) Patent No.: US 11,700,885 B2
(45) Date of Patent: Jul. 18, 2023

(54) AEROSOL GENERATION DEVICE INCLUDING MAINSTREAM SMOKE PASSAGE AND PRESSURE DETECTION PASSAGE

(71) Applicant: KT&G CORPORATION, Daejeon (KR)

(72) Inventors: Jung Ho Han, Daejeon (KR); Jae Sung Choi, Hanam-si (KR); Hun Il Lim, Seoul (KR); Tae Hun Kim, Yongin-si (KR); Hyung Jin Jung, Seoul (KR)

(73) Assignee: KT&G CORPORATION, Daejeon (KR)

( * ) Notice: Subject to any disclaimer, the term of this patent is extended or adjusted under 35 U.S.C. 154(b) by 364 days.

(21) Appl. No.: 16/652,915

(22) PCT Filed: Oct. 25, 2018

(86) PCT No.: PCT/KR2018/012685
§ 371 (c)(1),
(2) Date: Apr. 1, 2020

(87) PCT Pub. No.: WO2019/088562
PCT Pub. Date: May 9, 2019

(65) Prior Publication Data
US 2020/0229501 A1    Jul. 23, 2020

(30) Foreign Application Priority Data

Oct. 30, 2017   (KR) ........................ 10-2017-0142578
May 17, 2018   (KR) ........................ 10-2018-0056766
Sep. 5, 2018   (KR) ........................ 10-2018-0106156

(51) Int. Cl.
*A24F 13/00*    (2006.01)
*A24F 40/42*    (2020.01)
(Continued)

(52) U.S. Cl.
CPC ............ *A24F 40/42* (2020.01); *A24B 15/167* (2016.11); *A24D 1/20* (2020.01); *A24D 3/17* (2020.01);
(Continued)

(58) Field of Classification Search
CPC ....................................................... A24F 47/00
(Continued)

(56) References Cited

U.S. PATENT DOCUMENTS 5,348,027 A   9/1994   Barnes et al.
5,388,594 A   2/1995   Counts et al.
(Continued)

FOREIGN PATENT DOCUMENTS

CA   2 778 903 A1   5/2011
CA   2 970 045 A1   6/2016
(Continued)

OTHER PUBLICATIONS

Extended European Search Report dated Oct. 15, 2021 in European Application No. 18872138.5.
(Continued)

*Primary Examiner* — Phuong K Dinh
(74) *Attorney, Agent, or Firm* — Sughrue Mion, PLLC

(57) ABSTRACT

An aerosol generation device includes a case into which a cigarette is inserted, a heater disposed in the case and configured to heat the cigarette inserted into the case, a mainstream smoke passage connecting an end portion of the cigarette to the outside, and a pressure detection sensor configured to detect a change in a pressure of air inhaled to pass through the cigarette.

23 Claims, 11 Drawing Sheets

(51) Int. Cl.

| | |
|---|---|
| *A24F 40/90* | (2020.01) |
| *A24F 40/46* | (2020.01) |
| *A24B 15/167* | (2020.01) |
| *A24F 40/20* | (2020.01) |
| *A24F 40/30* | (2020.01) |
| *A24D 3/17* | (2020.01) |
| *A24D 1/20* | (2020.01) |
| *A24F 40/60* | (2020.01) |
| *F21V 3/00* | (2015.01) |
| *F21V 5/00* | (2018.01) |
| *G02B 19/00* | (2006.01) |
| *H05B 3/54* | (2006.01) |
| *A24F 40/485* | (2020.01) |
| *A24F 40/10* | (2020.01) |
| *A24F 40/44* | (2020.01) |
| *A24F 40/40* | (2020.01) |
| *A24F 40/57* | (2020.01) |
| *A24F 40/65* | (2020.01) |
| *H05K 1/02* | (2006.01) |
| *H05K 1/14* | (2006.01) |
| *H05K 1/18* | (2006.01) |
| *A24F 40/50* | (2020.01) |
| *A24F 40/95* | (2020.01) |
| *A24F 15/01* | (2020.01) |
| *A24F 40/51* | (2020.01) |
| *F21Y 115/10* | (2016.01) |

(52) U.S. Cl.
CPC .............. *A24F 15/01* (2020.01); *A24F 40/10* (2020.01); *A24F 40/20* (2020.01); *A24F 40/30* (2020.01); *A24F 40/40* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/51* (2020.01); *F21Y 2115/10* (2016.08); *H05K 2201/012* (2013.01); *H05K 2201/0154* (2013.01); *H05K 2201/10219* (2013.01)

(58) Field of Classification Search
USPC ................................................ 131/328–329
See application file for complete search history.

(56) References Cited

U.S. PATENT DOCUMENTS

| | | | |
|---|---|---|---|
| 5,408,574 A | | 4/1995 | Deevi et al. |
| 5,479,948 A | * | 1/1996 | Counts .................... A24F 40/46 131/194 |
| 5,505,214 A | | 4/1996 | Collins et al. |
| 5,555,476 A | | 9/1996 | Suzuki et al. |
| 5,665,262 A | | 9/1997 | Hajaligol et al. |
| 5,692,525 A | | 12/1997 | Counts et al. |
| 5,723,228 A | | 3/1998 | Okamoto |
| 5,750,964 A | | 5/1998 | Counts et al. |
| 5,878,752 A | | 3/1999 | Adams et al. |
| 5,902,501 A | | 5/1999 | Nunnally et al. |
| 5,934,289 A | | 8/1999 | Watkins et al. |
| 5,949,346 A | | 9/1999 | Suzuki et al. |
| 5,954,979 A | * | 9/1999 | Counts .................. A24F 40/485 131/194 |
| 5,970,719 A | | 10/1999 | Merritt |
| 6,026,820 A | | 2/2000 | Baggett, Jr. et al. |
| 6,615,840 B1 | | 9/2003 | Fournier et al. |
| 6,803,550 B2 | | 10/2004 | Sharpe et al. |
| 6,810,883 B2 | | 11/2004 | Felter et al. |
| 7,082,825 B2 | | 8/2006 | Aoshima et al. |
| 7,594,945 B2 | | 9/2009 | Kim et al. |
| 7,682,571 B2 | | 3/2010 | Kim et al. |
| 7,726,320 B2 | | 6/2010 | Robinson et al. |
| 8,205,622 B2 | | 6/2012 | Pan |
| 8,558,147 B2 | | 10/2013 | Greim et al. |
| 8,602,037 B2 | | 12/2013 | Inagaki |
| 8,689,804 B2 | | 4/2014 | Fernando et al. |
| 8,833,364 B2 | | 9/2014 | Buchberger |
| 8,997,754 B2 | | 4/2015 | Tucker et al. |
| 9,084,440 B2 | | 7/2015 | Zuber et al. |
| 9,165,484 B2 | | 10/2015 | Choi |
| 9,295,286 B2 | | 3/2016 | Shin |
| 9,347,644 B2 | | 5/2016 | Araki et al. |
| 9,405,148 B2 | | 8/2016 | Chang et al. |
| 9,420,829 B2 | | 8/2016 | Thorens et al. |
| 9,516,899 B2 | | 12/2016 | Plojoux et al. |
| 9,532,600 B2 | | 1/2017 | Thorens et al. |
| 9,532,603 B2 | * | 1/2017 | Plojoux ................. A24F 40/485 |
| 9,541,820 B2 | | 1/2017 | Ogawa |
| 9,693,587 B2 | | 7/2017 | Plojoux et al. |
| 9,713,345 B2 | | 7/2017 | Farine et al. |
| 9,814,269 B2 | | 11/2017 | Li et al. |
| 9,839,238 B2 | | 12/2017 | Worm et al. |
| 9,844,234 B2 | | 12/2017 | Thorens et al. |
| 9,848,651 B2 | | 12/2017 | Wu |
| 9,854,845 B2 | | 1/2018 | Plojoux et al. |
| 9,949,507 B2 | | 4/2018 | Flick |
| 9,974,117 B2 | | 5/2018 | Qiu |
| 10,070,667 B2 | | 9/2018 | Lord et al. |
| 10,104,909 B2 | | 10/2018 | Han et al. |
| 10,104,911 B2 | | 10/2018 | Thorens et al. |
| 10,136,673 B2 | | 11/2018 | Mironov |
| 10,136,675 B2 | | 11/2018 | Li et al. |
| 10,143,232 B2 | | 12/2018 | Talon |
| 10,238,149 B2 | | 3/2019 | Hon |
| 10,390,564 B2 | | 8/2019 | Fernando et al. |
| 10,412,994 B2 | | 9/2019 | Schennum et al. |
| 10,426,193 B2 | | 10/2019 | Schennum et al. |
| 10,548,350 B2 | | 2/2020 | Greim et al. |
| 10,555,555 B2 | | 2/2020 | Fernando et al. |
| 10,602,778 B2 | | 3/2020 | Hu et al. |
| 10,617,149 B2 | | 4/2020 | Malgat et al. |
| 10,694,783 B2 | | 6/2020 | Jochnowitz |
| 10,701,973 B2 | | 7/2020 | Lee |
| 10,757,975 B2 | | 9/2020 | Batista et al. |
| 10,842,194 B2 | | 11/2020 | Batista et al. |
| 10,973,087 B2 | | 4/2021 | Wang et al. |
| 11,051,545 B2 | | 7/2021 | Batista et al. |
| 11,051,550 B2 | | 7/2021 | Lin et al. |
| 11,147,316 B2 | | 10/2021 | Farine et al. |
| 2003/0226837 A1 | | 12/2003 | Blake et al. |
| 2004/0089314 A1 | | 5/2004 | Felter et al. |
| 2004/0149737 A1 | | 8/2004 | Sharpe et al. |
| 2005/0142036 A1 | | 6/2005 | Kim et al. |
| 2006/0267614 A1 | | 11/2006 | Lee et al. |
| 2007/0007266 A1 | | 1/2007 | Sasaki et al. |
| 2007/0074734 A1 | | 4/2007 | Braunshteyn et al. |
| 2007/0246382 A1 | | 10/2007 | He |
| 2007/0267031 A1 | | 11/2007 | Hon |
| 2010/0074616 A1 | | 3/2010 | Kewitsch |
| 2010/0313901 A1 | | 12/2010 | Fernando et al. |
| 2011/0226236 A1 | | 9/2011 | Buchberger |
| 2011/0234069 A1 | | 9/2011 | Chen et al. |
| 2013/0014772 A1 | | 1/2013 | Liu |
| 2013/0220466 A1 | | 8/2013 | Zandiyeh et al. |
| 2013/0228191 A1 | | 9/2013 | Newton |
| 2013/0255675 A1 | | 10/2013 | Liu |
| 2014/0060554 A1 | | 3/2014 | Collett et al. |
| 2014/0069424 A1 | | 3/2014 | Poston et al. |
| 2014/0209105 A1 | | 7/2014 | Sears et al. |
| 2014/0217085 A1 | | 8/2014 | Alima |
| 2014/0261487 A1 | | 9/2014 | Chapman et al. |
| 2014/0286630 A1 | | 9/2014 | Buchberger |
| 2014/0339509 A1 | | 11/2014 | Choi et al. |

(56) References Cited

U.S. PATENT DOCUMENTS

| | | |
|---|---|---|
| 2014/0345633 A1 | 11/2014 | Talon et al. |
| 2014/0353856 A1 | 12/2014 | Dubief |
| 2015/0020831 A1 | 1/2015 | Weigensberg et al. |
| 2015/0163859 A1 | 6/2015 | Schneider et al. |
| 2015/0223520 A1 | 8/2015 | Phillips et al. |
| 2015/0230521 A1 | 8/2015 | Talon |
| 2015/0282527 A1 | 10/2015 | Henry, Jr. |
| 2015/0327596 A1 | 11/2015 | Alarcon et al. |
| 2016/0103364 A1 | 4/2016 | Nam et al. |
| 2016/0128386 A1 | 5/2016 | Chen |
| 2016/0174613 A1 | 6/2016 | Zuber et al. |
| 2016/0205998 A1 | 7/2016 | Matsumoto et al. |
| 2016/0321879 A1 | 11/2016 | Oh et al. |
| 2016/0324216 A1 | 11/2016 | Li et al. |
| 2016/0331030 A1 | 11/2016 | Ampolini et al. |
| 2016/0345625 A1 | 12/2016 | Liu |
| 2017/0020195 A1 | 1/2017 | Cameron |
| 2017/0042227 A1 | 2/2017 | Gavrielov et al. |
| 2017/0049155 A1 | 2/2017 | Liu |
| 2017/0055589 A1 | 3/2017 | Fernando et al. |
| 2017/0119051 A1 | 5/2017 | Blandino et al. |
| 2017/0119053 A1 | 5/2017 | Henry, Jr. et al. |
| 2017/0143041 A1 | 5/2017 | Batista et al. |
| 2017/0188634 A1 | 7/2017 | Plojoux et al. |
| 2017/0197043 A1 | 7/2017 | Buchberger |
| 2017/0197046 A1 | 7/2017 | Buchberger |
| 2017/0214261 A1 | 7/2017 | Gratton |
| 2017/0238609 A1 | 8/2017 | Schlipf |
| 2017/0295844 A1 | 10/2017 | Thevenaz et al. |
| 2017/0303598 A1 | 10/2017 | Li et al. |
| 2017/0325505 A1 | 11/2017 | Force et al. |
| 2017/0347715 A1 | 12/2017 | Mironov et al. |
| 2018/0027878 A1 | 2/2018 | Dendy et al. |
| 2018/0028993 A1 | 2/2018 | Dubief |
| 2018/0160733 A1 | 6/2018 | Leadley et al. |
| 2018/0199630 A1 | 7/2018 | Qiu |
| 2019/0059448 A1 | 2/2019 | Talon |
| 2019/0159524 A1 | 5/2019 | Qiu |
| 2019/0281896 A1 | 9/2019 | Chapman et al. |
| 2020/0093177 A1 | 3/2020 | Han et al. |
| 2020/0093185 A1 | 3/2020 | Lim |
| 2020/0094997 A1 | 3/2020 | Menon et al. |
| 2020/0154765 A1 | 5/2020 | Lee et al. |
| 2020/0196670 A1 | 6/2020 | Alarcon et al. |
| 2020/0260790 A1 | 8/2020 | Kaufman et al. |
| 2020/0261000 A1 | 8/2020 | Kim et al. |
| 2020/0305240 A1 | 9/2020 | Holoubek et al. |
| 2020/0329772 A1 | 10/2020 | Kim et al. |
| 2020/0359681 A1 | 11/2020 | Han et al. |
| 2020/0404969 A1 | 12/2020 | Zuber et al. |
| 2021/0146067 A1 | 5/2021 | Buchberger |

FOREIGN PATENT DOCUMENTS

| | | |
|---|---|---|
| CN | 1078621 A | 11/1993 |
| CN | 1126425 A | 7/1996 |
| CN | 1190335 A | 8/1998 |
| CN | 1280661 A | 1/2001 |
| CN | 1491598 A | 4/2004 |
| CN | 1633247 A | 6/2005 |
| CN | 1871987 A | 12/2006 |
| CN | 101277622 A | 10/2008 |
| CN | 101301963 A | 11/2008 |
| CN | 101324490 A | 12/2008 |
| CN | 201253138 Y | 6/2009 |
| CN | 101518361 A | 9/2009 |
| CN | 201314692 Y | 9/2009 |
| CN | 101557728 A | 10/2009 |
| CN | 101637308 A | 2/2010 |
| CN | 201657047 U | 11/2010 |
| CN | 201996322 U | 10/2011 |
| CN | 102264251 A | 11/2011 |
| CN | 102595943 A | 7/2012 |
| CN | 202385727 U | 8/2012 |
| CN | 102665459 A | 9/2012 |
| CN | 202854031 U | 4/2013 |
| CN | 103099319 A | 5/2013 |
| CN | 202907797 U | 5/2013 |
| CN | 203040065 U | 7/2013 |
| CN | 103271447 A | 9/2013 |
| CN | 103477252 A | 12/2013 |
| CN | 103519351 A | 1/2014 |
| CN | 103653257 A | 3/2014 |
| CN | 103653258 A | 3/2014 |
| CN | 203492793 U | 3/2014 |
| CN | 103720056 A | 4/2014 |
| CN | 103889258 A | 6/2014 |
| CN | 103974635 A | 8/2014 |
| CN | 103974638 A | 8/2014 |
| CN | 103974640 A | 8/2014 |
| CN | 103997922 A | 8/2014 |
| CN | 104146353 A | 11/2014 |
| CN | 104188110 A | 12/2014 |
| CN | 104219973 A | 12/2014 |
| CN | 204120226 U | 1/2015 |
| CN | 204132401 U | 2/2015 |
| CN | 204146340 U | 2/2015 |
| CN | 104423130 A | 3/2015 |
| CN | 204317492 U | 5/2015 |
| CN | 204393344 U | 6/2015 |
| CN | 204483007 U | 7/2015 |
| CN | 104886776 A | 9/2015 |
| CN | 105188430 A | 12/2015 |
| CN | 204838003 U | 12/2015 |
| CN | 105326092 A | 2/2016 |
| CN | 205072064 U | 3/2016 |
| CN | 205180371 U | 4/2016 |
| CN | 205214209 U | 5/2016 |
| CN | 105722416 A | 6/2016 |
| CN | 205358225 U | 7/2016 |
| CN | 105852221 A | 8/2016 |
| CN | 105852225 A | 8/2016 |
| CN | 205456064 U | 8/2016 |
| CN | 105919162 A | 9/2016 |
| CN | 205624474 U | 10/2016 |
| CN | 106136331 A | 11/2016 |
| CN | 106163304 A | 11/2016 |
| CN | 106170215 A | 11/2016 |
| CN | 205671480 U | 11/2016 |
| CN | 106231934 A | 12/2016 |
| CN | 106235419 A | 12/2016 |
| CN | 205831079 U | 12/2016 |
| CN | 106418729 A | 2/2017 |
| CN | 106473232 A | 3/2017 |
| CN | 106473233 A | 3/2017 |
| CN | 106490686 A | 3/2017 |
| CN | 106535680 A | 3/2017 |
| CN | 106690427 A | 5/2017 |
| CN | 106723379 A | 5/2017 |
| CN | 106793834 A | 5/2017 |
| CN | 206197012 U | 5/2017 |
| CN | 106912985 A | 7/2017 |
| CN | 206314585 U | 7/2017 |
| CN | 106998816 A | 8/2017 |
| CN | 107105772 A | 8/2017 |
| CN | 206442590 U | 8/2017 |
| CN | 206443202 U | 8/2017 |
| CN | 206443214 U | 8/2017 |
| CN | 107173850 A | 9/2017 |
| CN | 107183789 A | 9/2017 |
| CN | 206462413 U | 9/2017 |
| CN | 107249366 A | 10/2017 |
| CN | 107278125 A | 10/2017 |
| CN | 206547882 U | 10/2017 |
| CN | 107801375 A | 3/2018 |
| CN | 108013512 A | 5/2018 |
| CN | 110325058 A | 10/2019 |
| CN | 110958841 A | 4/2020 |
| EA | 201290392 A1 | 10/2012 |
| EA | 201290240 A1 | 12/2012 |
| EA | 026076 B1 | 2/2017 |
| EP | 0 438 862 A2 | 7/1991 |
| EP | 0 917 831 A1 | 5/1999 |
| EP | 0 822 760 B1 | 6/2003 |

(56) References Cited

FOREIGN PATENT DOCUMENTS

| | | |
|---|---|---|
| EP | 1 947 965 A2 | 7/2008 |
| EP | 2 201 850 A1 | 6/2010 |
| EP | 2 316 286 A1 | 5/2011 |
| EP | 2 327 318 A1 | 6/2011 |
| EP | 2 340 729 A1 | 7/2011 |
| EP | 2 677 273 A1 | 12/2013 |
| EP | 2 921 065 A1 | 9/2015 |
| EP | 3104721 A1 | 12/2016 |
| EP | 3 257 386 B1 | 6/2019 |
| EP | 3 248 486 B1 | 8/2019 |
| EP | 3 569 076 A1 | 11/2019 |
| EP | 3 248 485 B1 | 4/2020 |
| EP | 3 656 229 A2 | 5/2020 |
| ER | 2368449 A1 | 9/2011 |
| GB | 2 301 894 A | 12/1996 |
| GB | 2514893 A | 12/2014 |
| JP | 48-63677 U | 8/1973 |
| JP | 62-15793 A | 1/1987 |
| JP | 63-68690 U | 5/1988 |
| JP | 6-73784 U | 10/1994 |
| JP | 7-72809 A | 3/1995 |
| JP | 7-184627 A | 7/1995 |
| JP | 8-122942 A | 5/1996 |
| JP | 9-75058 A | 3/1997 |
| JP | 9-161822 A | 6/1997 |
| JP | 9-228919 A | 9/1997 |
| JP | 10-37781 A | 2/1998 |
| JP | 2001-200495 A | 7/2001 |
| JP | 2002-514910 A | 5/2002 |
| JP | 2003-527127 A | 9/2003 |
| JP | 2004-212102 A | 7/2004 |
| JP | 2005-199913 A | 7/2005 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2012-513750 A | 6/2012 |
| JP | 2013-509160 A | 3/2013 |
| JP | 2013-524835 A | 6/2013 |
| JP | 2014-132560 A | 7/2014 |
| JP | 2014-216287 A | 11/2014 |
| JP | 2014-533513 A | 12/2014 |
| JP | 2015-13192 A | 1/2015 |
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-506901 A | 3/2017 |
| JP | 2017-510270 A | 4/2017 |
| JP | 2017-511123 A | 4/2017 |
| JP | 2017-127300 A | 7/2017 |
| JP | 2017-522876 A | 8/2017 |
| KR | 1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0044165 A | 4/2014 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-2017-0057535 A | 5/2017 |
| KR | 10-1733448 B1 | 5/2017 |
| KR | 10-2017-0067171 A | 6/2017 |
| KR | 10-2017-0083596 A | 7/2017 |
| KR | 10-2017-0117444 A | 10/2017 |
| KR | 10-2017-0118233 A | 10/2017 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |
| WO | 2011/015826 A1 | 2/2011 |
| WO | 2011/050964 A1 | 5/2011 |
| WO | 2011/063970 A1 | 6/2011 |
| WO | 2013/102609 A2 | 7/2013 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/117702 A1 | 8/2015 |
| WO | 2015/168828 A1 | 11/2015 |
| WO | 2015/174657 A1 | 11/2015 |
| WO | 2015/177046 A1 | 11/2015 |
| WO | 2015/189388 A1 | 12/2015 |
| WO | 2016/005601 A1 | 1/2016 |
| WO | 2016/009202 A1 | 1/2016 |
| WO | 2016/012795 A1 | 1/2016 |
| WO | 2016/091658 A1 | 6/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/199065 A1 | 12/2016 |
| WO | 2016/199066 A1 | 12/2016 |
| WO | 2016/207407 A1 | 12/2016 |
| WO | 2017/001520 A1 | 1/2017 |
| WO | 2017/001818 A1 | 1/2017 |

(56) References Cited

FOREIGN PATENT DOCUMENTS

| WO | 2017/005471 A1 | 1/2017 |
|---|---|---|
| WO | 2017/029089 A1 | 2/2017 |
| WO | 2017/077466 A1 | 5/2017 |
| WO | 2017/133056 A1 | 8/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Communication dated Dec. 3, 2021 from the Chinese Patent Office in Chinese Application No. 201880049465.2.
Communication dated Dec. 2, 2021 from the Chinese Patent Office in Chinese Application No. 201880048657.1.
Communication dated Dec. 2, 2021 from the Chinese Patent Office in Chinese Application No. 201880048444.9.
Communication dated Feb. 24, 2021 by the Japanese Patent Office in application No. 2020-503962.
Communication dated Mar. 23, 2021 by the Japanese Patent Office in application No. 2020-522897.
Communication dated Mar. 2, 2021 by the Japanese Patent Office in application No. 2020-523669.
Communication dated Mar. 30, 2021 by the Japanese Patent Office in application No. 2020-501446.
Communication dated Mar. 16, 2021 by the Japanese Patent Office in application No. 2020-521441.
Communication dated Feb. 9, 2021 by the Japanese Patent Office in application No. 2020-501205.
Communication dated Mar. 16, 2021 by the European Patent Office in application No. 18806877.9.
Communication dated Jul. 27, 2020 by the Russian Patent Office in application No. 2020110821.
Communication dated Jun. 11, 2020 by the Korean Patent Office in application No. 10-2018-0051469.
Communication dated Feb. 28, 2022 from the Chinese Patent Office in Chinese Application No. 201880063459.2.
Communication dated Mar. 29, 2022 from the Japanese Patent Office in Japanese Application No. 2020-522897.
Communication dated Mar. 3, 2022 from the Chinese Patent Office in Chinese Application No. 201880058682.8.
Wenxue Geng et al., "Technology Manual of a Programmable Controller", Science Technology, 1st Edition, 1996, p. 132 (2 pages total).
Extended European Search Report dated Sep. 9, 2021 in European Application No. 18873562.5.
Office Action dated Aug. 3, 2021 in Japanese Application No. 2020-503856.
Extended European Search Report dated Aug. 18, 2021 in European Application No. 18874344.7.
Extended European Search Report dated Jul. 30, 2021 in European Application No. 18874446.0.
Extended European Search Report dated Aug. 17, 2021 in European Application No. 18872432.2.
Office Action dated Aug. 17, 2021 in Japanese Application No. 2020-503962.
Extended European Search Report dated Aug. 10, 2021 in European Application No. 18873846.2.
Extended European Search Report dated Aug. 17, 2021 in European Application No. 18873943.7.
Extended European Search Report dated Aug. 10, 2021 in European Application No. 18874742.2.
Extended European Search Report dated Aug. 12, 2021 in European Application No. 18874837.0.
Extended European Search Report dated Aug. 20, 2021 in European Application No. 18874962.6.
Extended European Search Report dated Aug. 6, 2021 in European Application No. 18872527.9.
Extended European Search Report dated Sep. 2, 2021 in European Application No. 18874839.6.
Extended European Search Report dated Jul. 20, 2021 in European Application No. 18872006.4.
Office Action dated Sep. 3, 2021 in Chinese Application No. 201880035480.1.
Office Action dated Aug. 11, 2021 in Chinese Application No. 201880029050.9.
Extended European Search Report dated Jan. 15, 2021 in European Application No. 18799246.6.
Office Action dated May 25, 2020 in Russian Application No. 2019135871.
Office Action dated Jun. 10, 2020 in Korean Application No. 10-2018-0052137.
Office Action dated Oct. 5, 2020 in Korean Application No. 10-2020-0090577.
Office Action dated Oct. 16, 2020 in Korean Application No. 10-2020-0092553.
Extended European Search Report dated Nov. 16, 2020 in European Application No. 20189002.7.
Office Action dated Dec. 8, 2020 in Russian Application No. 2020113632.
Office Action dated Nov. 25, 2020 in Russian Application No. 2020124810.
Office Action dated Jan. 26, 2021 in Japanese Application No. 2020-502671.
Office Action dated Dec. 22, 2020 in Japanese Application No. 2020-502181.
Office Action dated Dec. 22, 2020 in Japanese Application No. 2020-503856.
Extended European Search Report dated Nov. 13, 2020 in European Application No. 20188970.6.
Office Action dated Nov. 10, 2020 in Japanese Application No. 2020-523671.
Office Action dated Nov. 24, 2020 in Russian Application No. 2020124811.
Office Action dated Aug. 12, 2019 in Korean Application No. 10-2019-0033722.
Office Action dated Jul. 2, 2019 in Korean Application No. 10-2019-0017392.
Office Action dated Jul. 3, 2019 in Korean Application No. 10-2019-0016835.
Office Action dated May 18, 2019 in Korean Application No. 10-2018-0090063.
Office Action dated Oct. 25, 2019 in Korean Application No. 10-2018-0078296.
Office Action dated Oct. 15, 2019 in Korean Application No. 10-2018-0074188.
Office Action dated Oct. 8, 2019 in Korean Application No. 10-2018-0072992.
Office Action dated Oct. 8, 2019 in Korean Application No. 10-2018-0072935.
Office Action dated Sep. 6, 2019 in Korean Application No. 10-2018-0069645.
Office Action dated Jul. 10, 2019 in Korean Application No. 10-2018-0064487.
Office Action dated Jun. 24, 2019 in Korean Application No. 10-2018-0062137.
Office Action dated Jun. 19, 2019 in Korean Application No. 10-2018-0059580.
Office Action dated May 13, 2019 in Korean Application No. 10-2018-0058596.
Office Action dated May 3, 2019 in Korean Application No. 10-2018-0055120.
Office Action dated Dec. 9, 2019 in Korean Application No. 10-2018-0052133.
Office Action dated Dec. 9, 2019 in Korean Application No. 10-2018-0051469.
Office Action dated Dec. 9, 2019 in Korean Application No. 10-2018-0051467.

(56) References Cited

OTHER PUBLICATIONS

International Search Report dated Apr. 16, 2019 in International Application No. PCT/KR2018/012899.
International Search Report dated Apr. 26, 2019 in International Application No. PCT/KR2018/012895.
International Search Report dated May 17, 2019 in International Application No. PCT/KR2018/012810.
International Search Report dated May 17, 2019 in International Application No. PCT/KR2018/012809.
International Search Report dated May 17, 2019 in International Application No. PCT/KR2018/012808.
International Search Report dated May 3, 2019 in International Application No. PCT/KR2018/012807.
International Search Report dated May 17, 2019 in International Application No. PCT/KR2018/012776.
International Search Report dated Apr. 3, 2019 in International Application No. PCT/KR2018/012775.
International Search Report dated Apr. 3, 2019 in International Application No. PCT/KR2018/012774.
International Search Report dated Apr. 3, 2019 in International Application No. PCT/KR2018/012773.
International Search Report dated May 20, 2019 in International Application No. PCT/KR2018/012685.
International Search Report dated May 21, 2019 in International Application No. PCT/KR2018/012676.
International Search Report dated Nov. 26, 2018 in International Application No. PCT/KR2018/005767.
International Search Report dated Aug. 28, 2018 in International Application No. PCT/KR2018/005693.
International Search Report dated Nov. 2, 2018 in International Application No. PCT/KR2018/005306.
Office Action dated Jan. 24, 2022 in Chinese Application No. 201880030661.5.
Office Action dated Dec. 24, 2021 in Chinese Application No. 201880055847.6.
Office Action dated Dec. 20, 2021 in Chinese Application No. 201880048655.2.
Office Action dated Jan. 4, 2022 in Chinese Application No. 201880048703.8.
Office Action dated Jan. 18, 2022 in Chinese Application No. 201880052857.4.
Office Action dated Jan. 30, 2022 in Chinese Application No. 201880052855.5.
"PCB Design and Processing", Seping, pp. 32-35, Beijing Institute of Technology Publishing House, Feb. 2017, Feb. 28, 2017 (6 pages total).
Office Action dated Dec. 31, 2021 in Chinese Application No. 201880049189.X.
Office Action dated Apr. 5, 2019 in Korean Application No. 10-2019-0017393.
Office Action dated Apr. 25, 2019 in Korean Application No. 10-2019-0033722.
Office Action dated Apr. 25, 2019 in Korean Application No. 10-2019-0033723.
Office Action dated Jun. 7, 2021 in Canadian Application No. 3,076,886.
Office Action dated Feb. 9, 2018 in Korean Application No. 10-2017-0058786.
Office Action dated Nov. 1, 2022 issued by the Japanese Patent Office in Japanese Application No. 2020-501205.
Office Action dated Dec. 29, 2022 issued by the Chinese Patent Office in Chinese Application No. 201880055847.6.
Office Action dated Dec. 20, 2022 issued by the Japanese Patent Office in Japanese Application No. 2021-122551.
Office Action dated Jan. 10, 2023 issued by the Japanese Patent Office in Japanese Application No. 2021-080578.
Office Action dated Jul. 4, 2022, issued in Chinese Application No. 201880048657.1.
Office Action dated Aug. 26, 2022, issued in Chinese Application No. 201880048703.8.
Office Action dated Jun. 28, 2022, issued in Japanese Application No. 2020-522897.
Office Action dated Jul. 12, 2022, issued in Chinese Application No. 201880049189.X.
Su Zuen et al., "Heat Transfer", Dalian Maritime University Press, Feb. 28, 1989, pp. 12-13 (9 pages total).
Office Action dated Jun. 22, 2022, issued in Chinese Application No. 201880048444.9.
Office Action dated Jan. 20, 2023 from the China National Intellectual Property Administration in CN Application No. 202010761215.0.
Office Action dated Jan. 28, 2023 from the China National Intellectual Property Administration in CN Application No. 202010761219.9.
Office Action dated Feb. 14, 2023 from the Japanese Patent Office in JP Application No. 2022-074915.
Jia Wei-Ping et al., "Determination of Aerosol Concentration in Mainstream Cigarette Smoke Based on Online Impact", Tobacco Science and Technology, Manufacturing Technology, Dec. 2010, vol. 281 (4 pages total).
Office Action dated Mar. 30, 2023 in Chinese Application No. 201880030661.5.
Office Action dated May 12, 2023 in Chinese Application No. 201880048703.8.

* cited by examiner

AEROSOL GENERATION DEVICE INCLUDING MAINSTREAM SMOKE PASSAGE AND PRESSURE DETECTION PASSAGE

CROSS REFERENCE TO RELATED APPLICATIONS

This application is a National Stage of International Application No. PCT/KR2018/012685 filed Oct. 25, 2018, claiming priority based on Korean Patent Application No. 10-2017-0142578 filed Oct. 30, 2017, Korean Patent Application No. 10-2018-0056766 filed May 17, 2018 and Korean Patent Application No. 10-2018-0106156 filed Sep. 5, 2018.

TECHNICAL FIELD

The present disclosure relates to an aerosol generation device, and more particularly, to a non-combustible type aerosol generation device.

BACKGROUND ART

Recently, the demand for alternative ways to overcome the shortcomings of common cigarettes has increased. For example, there is an increasing demand for a method of generating aerosol by heating an aerosol generation material in a cigarette, not for a method of generating aerosol by combusting a cigarette. Accordingly, research about a non-combustible type aerosol generation device, such as, a heating-type cigarette or a heating-type aerosol generation device, is actively performed.

A non-combustible type aerosol generation device refers to a device that generates aerosol from an aerosol generation material in a cigarette by heating the cigarette to a certain temperature, without combusting the cigarette, so that the generated aerosol can be inhaled with air.

The non-combustible type aerosol generation device may detect a user's puff to inhale a cigarette. The aerosol generation device may detect a puff by measuring inhale pressure by using a pressure detection sensor. The detection of a puff is important in controlling an aerosol generation device, a stable detection of an inhale pressure is needed.

DESCRIPTION OF EXEMPLARY EMBODIMENTS

Technical Problem

Provided is an aerosol generation device capable of stably sensing an inhale pressure of air inhaled through a cigarette.

Provided is an aerosol generation device capable of providing various experiences and convenience of use to a user by complexly using an aerosol generation source and a cigarette.

Provided is an aerosol generation device capable of providing aerosol including rich flavor and nicotine by allowing flow of the aerosol generated by heating an aerosol generation source to pass through a cigarette.

Solution to Problem

According to an aspect of the present disclosure, an aerosol generation device includes a case into which a cigarette is inserted, a heater disposed in the case and configured to heat the cigarette inserted into the case, a mainstream smoke passage connecting an end portion of the cigarette to the outside, and a pressure detection sensor configured to detect a change in pressure of air inhaled to pass through the cigarette.

The aerosol generation device may further include a pressure detection passage that connects the end portion of the cigarette to the pressure detection sensor, and is formed independently of the mainstream smoke passage.

A cross-section of the mainstream smoke passage may be greater than or equal to 15% of a cross-section of the cigarette.

The cross-section of the mainstream smoke passage may be less than or equal to 70% of the cross-section of the cigarette.

The pressure detection passage may include two or more pressure detection passages.

A cross-section of the pressure detection passage may be greater than or equal to 2 $mm^2$ and less than the cross-section of the mainstream smoke passage.

An accommodation portion for accommodating the pressure detection sensor may be provided in the case, a protection film for preventing leakage of air may be provided between the accommodation portion and the pressure detection sensor, and two or more through-holes through which the pressure detection sensor is exposed and respectively connected to two or more pressure detection passages may be provided in the protection film.

An accommodation portion for accommodating the pressure detection sensor may be provided in the case, a protection film for preventing leakage of air may be provided between the accommodation portion and the pressure detection sensor, and a through-hole through which the pressure detection sensor is exposed and connected to the pressure detection passage may be provided in the protection film.

The pressure detection passage may extend in an extension direction of the cigarette and include a first end portion that is connected to the end portion of the cigarette and a second end portion that is opposite to the first end portion, the second end portion being an open end portion connected to the pressure detection sensor.

The pressure detection passage may extend in an extension direction of the cigarette and include a first end portion that is connected to the end portion of the cigarette and a second end portion that is opposite to the first end portion, the second end portion being a closed end portion, and a pressure detection hole connected to the pressure detection sensor may be provided between the first end portion and the second end portion.

The pressure detection passage may include a main passage extending in an extension direction of the cigarette and a branch passage branched from the main passage and having, at an end portion thereof, a pressure detection hole connected to the pressure detection sensor.

The branch passage may obliquely extend toward the end portion of the cigarette.

The aerosol generation device may further include a vaporizer configured to generate an aerosol from a liquid and transfer the generated liquid toward the cigarette via the mainstream smoke passage.

The heater may surround an outer circumference of the cigarette.

The heater may be inserted into the cigarette through the end portion of the cigarette.

The mainstream smoke passage may surround at least part of the heater.

The aerosol generation device may further include a cigarette support portion supporting the end portion of the cigarette, wherein the mainstream smoke passage is formed to penetrate the inside of the cigarette support portion, the cigarette support portion may include a pressure detection hole through which part of the mainstream smoke passage is exposed to the outside, and the pressure detection sensor is disposed in the pressure detection hole.

The aerosol generation device may further include a circuit substrate disposed outside of the cigarette support portion, wherein the pressure detection sensor is mounted on the circuit substrate.

The aerosol generation device may further include a protection film disposed between the pressure detection sensor and the pressure detection hole to surround at least part of the pressure detection sensor.

The protection film may have elasticity, and when the circuit substrate is coupled to the cigarette support portion, the protection film may be pressed against the cigarette support portion and be deformed.

The cigarette support portion may include a step formed at an edge of the pressure detection hole to press the protection film.

Advantageous Effects of Disclosure

According to an aerosol generation device according to exemplary embodiments of the present disclosure, a puff may be stably detected by stably measuring an inhale pressure of air inhaled to pass through a cigarette.

Aerosol including a flavor appropriate for a user and nicotine may be provided by generating an aerosol from an aerosol generation source and allowing flow of the generated aerosol to pass through a cigarette.

BEST MODE

The terms used in the present disclosure have been selected from currently widely used general terms in consideration of the functions in the present disclosure. However, the terms may vary according to the intention of one of ordinary skill in the art, case precedents, and the advent of new technologies. Furthermore, for special cases, meanings of the terms selected by the applicant are described in detail in the description section. Accordingly, the terms used in the present disclosure are defined based on their meanings in relation to the contents discussed throughout the specification, not by their simple meanings.

When a part may "include" a certain constituent element, unless specified otherwise, it may not be construed to exclude another constituent element but may be construed to further include other constituent elements. Furthermore, terms such as "portion", "unit", "module", and "block" stated in the specification may signify a unit to process at least one function or operation and the unit may be embodied by hardware, software, or a combination of hardware and software.

Hereinafter, exemplary embodiments of the present disclosure will be described in detail with reference to the accompanying drawings so that those skilled in the art may easily implement the present invention. However, the present disclosure may be implemented in various different ways and are not limited to the exemplary embodiments described herein.

Exemplary embodiments of the present disclosure are described in detail with reference to the accompanying drawings.

Figure 1:
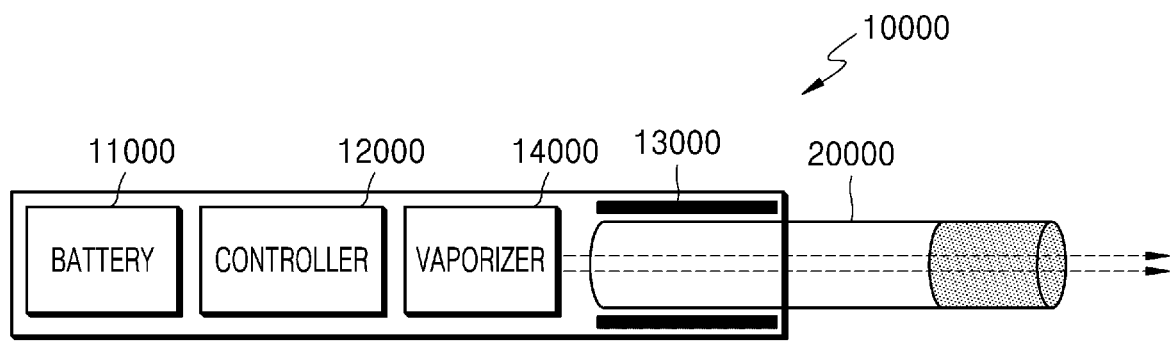
FIGS. 1 and 2 illustrate examples of a cigarette being inserted into an aerosol generation device.
Figure 2:
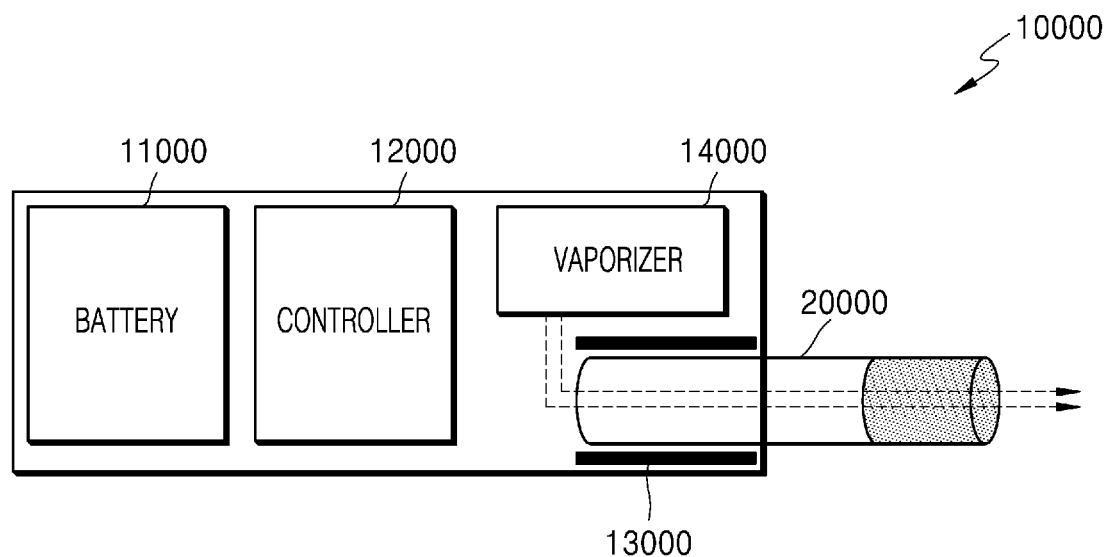

FIGS. 1 and 2 illustrate examples of a cigarette being inserted into an aerosol generation device.

Referring to FIGS. 1 and 2, an aerosol generation device 10000 includes a battery 11000, a controller 12000, a heater 13000, and a vaporizer 14000. Furthermore, a cigarette 20000 may be inserted into an inner space of the aerosol generation device 10000.

Only constituent elements of the aerosol generation device 10000 related to the present exemplary embodiment are illustrated in FIGS. 1 and 2. Accordingly, a person skilled in the art related to the present exemplary embodiment would understand that other general constituent elements in addition to the constituent elements illustrated in FIGS. 1 and 2 may be further included in the aerosol generation device 10000.

Furthermore, although FIGS. 1 and 2 illustrate that the aerosol generation device 10000 includes the heater 13000, as necessary, the heater 13000 may be omitted.

FIG. 1 illustrates that the battery 11000, the controller 12000, the vaporizer 14000, and the heater 13000 are linearly arranged. Furthermore, FIG. 2 illustrates that the vaporizer 14000 and the heater 13000 are arranged in parallel. However, the internal structure of the aerosol generation device 10000 is not limited to the illustration of FIG. 1 or 2. In other words, according to the design of the aerosol generation device 10000, the arrangement of the battery 11000, the controller 12000, the vaporizer 14000, and the heater 13000 may be changed.

When the cigarette 20000 is inserted into the aerosol generation device 10000, the aerosol generation device 10000 generates aerosol from the vaporizer 14000 by operating the vaporizer 14000. The aerosol generated by the vaporizer 14000 is transferred to a user by passing through the cigarette 20000. The vaporizer 14000 will be described below in detail.

The battery 11000 supplies power used to operate the aerosol generation device 10000. For example, the battery 11000 may supply power to heat the heater 13000 or the vaporizer 14000, or may supply power needed to operate the controller 12000. Furthermore, the battery 11000 may supply power needed to operate a display, a sensor, or a motor installed in the aerosol generation device 10000.

The controller 12000 generally controls an operation of the aerosol generation device 10000. In detail, the controller 12000 controls not only the battery 11000, the heater 13000, and the vaporizer 14000, but also operations of other elements included in the aerosol generation device 10000. Furthermore, the controller 12000 may determine whether the aerosol generation device 10000 is in an operable state by checking the state of each of the constituent elements of the aerosol generation device 10000.

The controller 12000 includes at least one processor. A processor may be implemented by an array of a plurality of logic gates, or by a combination of a microprocessor and a memory for storing a program executable by the microprocessor. Furthermore, a person skilled in the art to which the present exemplary embodiment belongs would understand that the processor may be implemented by other forms of hardware.

The heater 13000 may be heated by the power supplied by the battery 11000. For example, when the cigarette 20000 is inserted into the aerosol generation device 10000, the heater 13000 may be located outside the cigarette 20000. As an example, the heater 13000 may surround the outer circumference of the cigarette 20000. Accordingly, the heater 13000 that is heated may increase the temperature of an aerosol generation material in a cigarette.

The heater 13000 may be a resistive heater. For example, the heater 13000 includes an electrically conductive track, and as current flows in the electrically conductive track, the heater 13000 may be heated. However, the heater 13000 is not limited to the above-described example, and anything that can be heated to a desired temperature may be adopted therefor without limitation. The desired temperature may be previously set in the aerosol generation device 10000, or may be set by a user.

As another example, the heater 13000 may be an induction heating-type heater. In detail, the heater 13000 may include an electrically conductive coil to heat the cigarette 20000 in an induction heating method, and the cigarette 20000 may include a susceptor that is heated by the induction heating-type heater.

Although FIGS. 1 and 2 illustrate that the heater 13000 is disposed outside the cigarette 20000, the present disclosure is not limited thereto. For example, the heater 13000 may include a tube-type heating element, a plate-type heating element, a needle-type heating element, or a rod-type heating element, and the inside or outside of the cigarette 20000 may be heated according to the shape of a heating element.

Furthermore, a plurality of heaters may be used to implement the heater 13000 in the aerosol generation device 10000. In this case, the heaters 13000 may be disposed to be inserted into the cigarette 20000 or disposed outside the cigarette 20000. Furthermore, some of the heaters 13000 may be disposed to be inserted into the cigarette 20000, while the others may be disposed outside the cigarette 20000. Furthermore, the shape of the heater 13000 is not limited to the shape illustrated in FIGS. 1 and 2, and the heater 13000 may be manufactured in various shapes.

The vaporizer 14000 may generate aerosol by heating a liquid component, and the generated aerosol may be transferred to a user by passing through the cigarette 20000. In other words, the aerosol generated by the vaporizer 14000 may move along an air current passage of the aerosol generation device 10000, and the air current passage may transfer the aerosol generated by the vaporizer 14000 to a user through the cigarette.

For example, the vaporizer 14000 may include a liquid storing portion, a liquid transfer device, and a heating element, but the present disclosure is not limited thereto. For example, the liquid storing portion, the liquid transfer device, and the heating element are independent modules and may be included in the aerosol generation device 10000.

The liquid storing portion may store the liquid component. For example, the liquid component may be a liquid including a tobacco containing material having a volatile tobacco flavor component, or liquid including a non-tobacco material. The liquid storing portion may be manufactured to be detachable from the vaporizer 14000, or may be manufactured integrally with the vaporizer 14000.

For example, the liquid component may include water, solvent, ethanol, plant extract, flavoring, spices, or a vitamin mixture. The flavoring may include menthol, peppermint, spearmint oil, various fruit flavor components, and the like, but the present disclosure is not limited thereto. The spices may include a component capable of providing various spices or flavors to a user. The vitamin mixture may be a mixture of at least one of vitamin A, vitamin B, vitamin C, and vitamin E, but the present disclosure is not limited thereto. Furthermore, the liquid component may include an aerosol former such as glycerin and propylene glycol.

The liquid transfer device may transfer the liquid component of the liquid storing portion to the heating element. For example, the liquid transfer device may include a wick such as cotton fibers, ceramic fibers, glass fibers, or porous ceramics, but the present disclosure is not limited thereto.

The heating element is a component to heat the liquid component transferred by the liquid transfer device. For example, the heating element may include a metal heating wire, a metal hot plate, a ceramic heater, and the like, but the present disclosure is not limited thereto. Furthermore, the heating element may include a conductive filament such as a Nichrome wire, and may be wound around the liquid transfer device. The heating element may be heated by supply of a current and may transfer heat to the liquid component contacting the heating element, thereby heating the liquid component. As a result, aerosol may be generated.

For example, the vaporizer 14000 may be referred to as a cartomizer or an atomizer, but the naming is not limited thereto.

The aerosol generation device 10000 may further include elements other than the battery 11000, the controller 12000, and the heater 13000. For example, the aerosol generation device 10000 may include a display for output of visual information and/or a motor for output of haptic information. Furthermore, the aerosol generation device 10000 may include at least one sensor (a puff detection sensor, a temperature detection sensor, a cigarette insertion detection sensor, and the like). Furthermore, the aerosol generation device 10000 may be manufactured to have a structure that allows external air to be introduced or internal air to be discharged while the cigarette 20000 is inserted.

Although not illustrated in FIGS. 1 and 2, the aerosol generation device 10000 may form a system with a separate cradle. For example, the cradle may be used to charge the battery 11000 of the aerosol generation device 10000. Alternatively, the heater 13000 may be heated when the cradle and the aerosol generation device 10000 are coupled to each other.

The cigarette 20000 may have a similar structure to a general combustion-type cigarette. For example, the cigarette 20000 may be divided into a first part including the aerosol generation material and a second part including a filter and the like. Also, the second part of the cigarette 20000 may include the aerosol generation material. For example, the aerosol generation material formed in the form of granules, or capsules may be inserted into the second part.

The first part may be entirely inserted into the aerosol generation device 10000, and the second part may be exposed to the outside. Alternatively, only a portion of the first part may be inserted into the aerosol generation device 10000. Otherwise, the first part and a portion of the second part may be inserted into the aerosol generation device 10000. A user may inhale aerosol with the second part in the mouth. In this state, the aerosol is generated as the external air passes through the first part, and the generated aerosol is transferred to the mouth of the user by passing through the second part.

As an example, the external air may be introduced through at least one air passage formed in the aerosol generation device 10000. For example, opening and closing of the air passage and/or the size of the air passage formed in the aerosol generation device 10000 may be controlled by the user. Accordingly, an amount of vapor or a sense of smoking may be adjusted by the user. In another example, the external air may be introduced into the cigarette 20000 through at least one hole formed in a surface of the cigarette 20000.

Hereinafter, an example of the cigarette 20000 is described with reference to FIG. 3.

Figure 3:
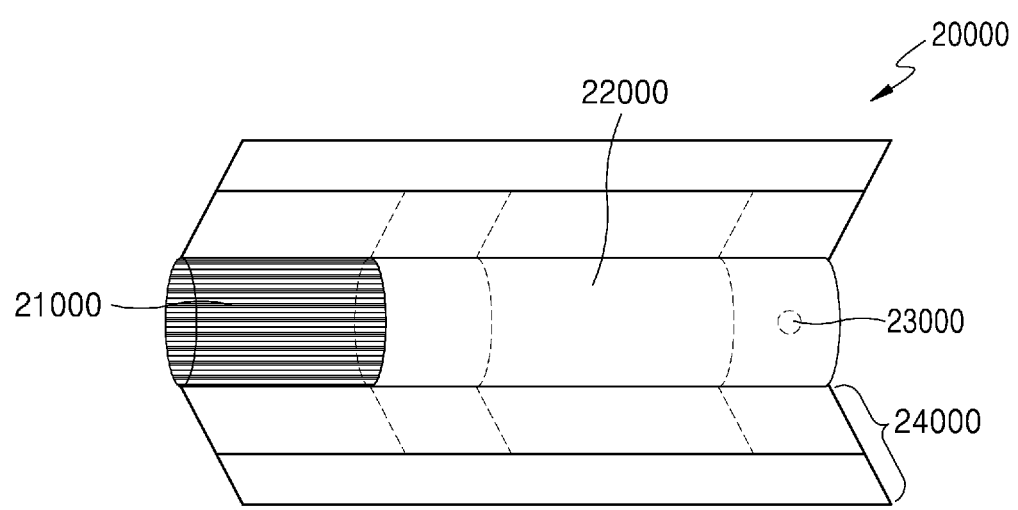
FIG. 3 illustrates an example of a cigarette.

FIG. 3 illustrates an example of a cigarette.

Referring to FIG. 3, the cigarette 20000 includes a tobacco rod 21000 and a filter rod 22000. The first part described with reference to FIGS. 1 and 2 includes the tobacco rod 21000, and the second part includes the filter rod 22000.

Although FIG. 3 illustrates that the filter rod 22000 is a single segment, the present disclosure is not limited thereto. In other words, the filter rod 22000 may include a plurality of segments. For example, the filter rod 22000 may include a first segment for cooling an aerosol and a second segment for filtering a certain component included in the aerosol. Furthermore, as necessary, the filter rod 22000 may further include at least one segment for performing another function.

The cigarette 20000 may be packaged with at least one wrapper 24000. At least one hole through which the external air is introduced or an internal gas is exhausted may be formed in the wrapper 24000. As an example, the cigarette 20000 may be packaged with one wrapper 24000. In another example, the cigarette 20000 may be packaged with two or more wrappers 24000 superposed one upon another. For example, the tobacco rod 21000 may be packaged with a first wrapper, and the filter rod 22000 may be packaged with a second wrapper. Then, the tobacco rod 21000 and the filter rod 22000 packaged with individual wrappers are coupled to each other, and the entirety of the cigarette 20000 may be repackaged with a third wrapper. When each of the tobacco rod 21000 and the filter rod 22000 is configured with a plurality of segments, each segment may be packaged with an individual wrapper. The cigarette 20000 having segments respectively packaged with individual wrappers may be entirely repackaged with another wrapper.

The tobacco rod 21000 includes an aerosol generation material. For example, aerosol generation material may include at least one of glycerin, propylene glycol, ethylene glycol, dipropylene glycol, diethylene glycol, triethylene glycol, tetraethylene glycol, or oleyl alcohol, but the present disclosure is not limited thereto. Furthermore, the tobacco rod 21000 may contain other additives such as a flavor, a humectant, and/or organic acid. Furthermore, the tobacco rod 21000 may include a flavor liquid such as menthol or a moisturizer by spraying the flavor liquid to the tobacco rod 21000.

The tobacco rod 21000 may be manufactured in various ways. For example, the tobacco rod 21000 may be manufactured using a sheet or a strand. Furthermore, the tobacco rod 21000 may be manufactured using shredded tobacco generated by finely cutting a tobacco sheet. Furthermore, the tobacco rod 21000 may be surrounded by a heat conductive material. For example, the heat conductive material may be a metal foil such as an aluminum foil, but the present disclosure is not limited thereto. As an example, the heat conductive material surrounding the tobacco rod 21000 may disperse heat to the tobacco rod 21000 to increase thermal conductivity of the heat applied to the tobacco rod 21000, thereby improving the taste of tobacco. Furthermore, the heat conductive material surrounding the tobacco rod 21000 may function as a susceptor that is heated by the induction heating-type heater. In this state, although not illustrated in the drawing, the tobacco rod 21000 may further include an additional susceptor other than the heat conductive material surrounding the outside thereof.

The filter rod 22000 may be a cellulose acetate filter. There is no limitation in the shape of the filter rod 22000. For example, the filter rod 22000 may be a cylinder-type rod or a hollow tube-type rod. Furthermore, the filter rod 22000 may be a recess-type rod. When the filter rod 22000 includes a plurality of segments, at least one of the segments may be manufactured in a different shape.

The filter rod 22000 may be manufactured to generate flavor. As an example, a flavor liquid may be sprayed to the filter rod 22000, or a separate fabric coated with a flavor liquid may be inserted into the filter rod 22000.

Furthermore, the filter rod 22000 may include at least one capsule 23000. The capsule 23000 may perform a function of generating flavor or aerosol. For example, the capsule 23000 may have a structure of wrapping a liquid including flavoring with a membrane. Although the capsule 23000 may have a shape of a ball or a cylinder, the present disclosure is not limited thereto.

When the filter rod 22000 includes a segment for cooling an aerosol, a cooling segment may be manufactured of a polymer material or a biodegradable polymer material. For example, the cooling segment may be manufactured of pure polylactic acid only, but the present disclosure is not limited thereto. Alternatively, the cooling segment may be manufactured as a cellulose acetate filter having a plurality of holes. However, the cooling segment is not limited to the above-described example, and any other cooling segment capable of cooling the aerosol may be employed without limitation.

Although not illustrated in FIG. 3, the cigarette 20000 according to an exemplary embodiment may further include a pre-filter. The pre-filter is located at one side of the tobacco rod 21000 opposite to the filter rod 22000. The pre-filter may prevent the tobacco rod 21000 from escaping to the outside, and the aerosol liquefied from the tobacco rod 21000 during smoking from flowing into the aerosol generation device 10000 of FIGS. 1 and 2.

Figure 4A:
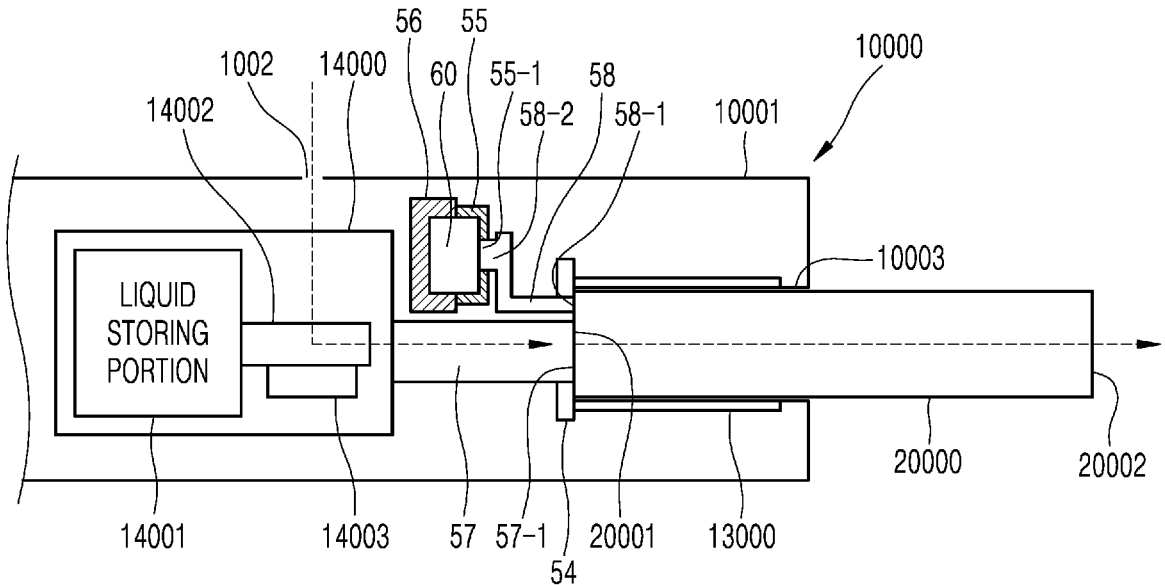
FIGS. 4A and 4B are schematic diagrams of an exemplary embodiment of an aerosol generation device.

FIG. 4A is a schematic diagram of an exemplary embodiment of the aerosol generation device 10000.

Referring to FIG. 4A, the aerosol generation device 10000 includes a case 10001 that forms the appearance. The case 10001 is provided with an insertion portion 10003 into which the cigarette 20000 is inserted.

The aerosol generation device 10000 may include a pressure detection sensor 60 that detects a change of the pressure of air inhaled to pass through the cigarette 20000. The pressure detection sensor 60 generates a signal by detecting an inhale pressure that is a pressure of air generated by a user inhaling the cigarette 20000 in a mouth (puff motion).

The detection signal of the pressure detection sensor 60 is transmitted to the controller 12000. The controller 12000 may control the aerosol generation device 10000 by using the pressure detection sensor 60 such that, after a predetermined number of puffing, for example, 14 times, the operations of the vaporizer 14000 and the heater 13000 are automatically terminated.

Furthermore, even when the frequency of puffing does not reach the predetermined number, for example, 14 times, the controller 12000 may forcibly terminate the operations of the vaporizer 14000 and the heater 13000 after a predetermined time, for example, 6 minutes, passes.

As described above, in the aerosol generation device 10000 according to the present exemplary embodiment, the aerosol generated by the vaporizer 14000 is transferred to the user by passing through the cigarette 20000. The vaporizer 14000 and the cigarette 20000 are connected by a mainstream smoke passage 57. Reference numerals 14001, 14002, and 14003 denote a liquid storing portion, a liquid transfer device, and a heating element for heating a liquid, respectively. The liquid storing portion 14001 may be in the form of an individually replaceable cartridge. The liquid storing portion 14001 may have a structure to refill the liquid. The vaporizer 14000 may be in the form of an entirely replaceable cartridge. The mainstream smoke passage 57 connects a first end portion 20001 of the cigarette 20000 to the outside so that the external air may be introduced into the cigarette 20000 by a motion of a user inhaling the cigarette 20000 in the mouth (puff motion). The external air is inhaled into the case 10001 through an air vent 10002 provided in the case 10001. The air passes through the vaporizer 14000. The air passed through vaporizer 14000 includes aerosol that is generated as the liquid is vaporized. The air passed through vaporizer 14000 is introduced into the first end portion 20001 of the cigarette 20000, that is, the opposite end portion of the filter rod 22000, through the mainstream smoke passage 57. The first end portion 20001 of the cigarette 20000 is an end portion located in the case 10001. The air passes through the tobacco rod 21000 and the filter rod 22000 to be inhaled by a smoker through a second end portion 20002.

The aerosol generation device 10000 according to the present exemplary embodiment includes a pressure detection passage 58. The pressure detection passage 58 connects the first end portion 20001 of the cigarette 20000 to the pressure detection sensor 60 so that the pressure detection sensor 60 detects the inhale pressure that is a pressure of the air generated by a puff of the user inhaling the cigarette 20000 in the mouth. The pressure detection passage 58 is formed independently of the mainstream smoke passage 57. As the pressure detection passage 58 and the mainstream smoke passage 57 are installed independently separated from each other, a liquid (leaked liquid) may be prevented from being introduced toward the pressure detection sensor 60.

The diameter of the pressure detection passage 58 may be set to be less than the diameter of the mainstream smoke passage 57. Furthermore, as air flow resistance (inhale resistance in the pressure detection passage 58) of the air flowing toward the cigarette 20000 through a space surrounding the pressure detection sensor 60 is set to be greater than air flow resistance (inhale resistance of a mainstream smoke air current) of the air flowing in the mainstream smoke passage 57, the flow of aerosol becomes smooth and an inhale pressure may be precisely measured.

An accommodation portion 56 for accommodating the pressure detection sensor 60 may be provided in the case 10001. A protection film 55 for protecting the pressure detection sensor 60 may be installed between the pressure detection sensor 60 and the accommodation portion 56. The protection film 55 may include a flexible material such as rubber, and surround at least part of the pressure detection sensor 60.

Hereinafter, the configurations of the mainstream smoke passage 57 and the pressure detection passage 58 are described in detail.

The pressure detection passage 58 and the mainstream smoke passage 57 are separated from each other to be independent of each other. An inner end portion 57-1 of the mainstream smoke passage 57 is connected to the first end portion 20001 of the cigarette 20000. The pressure detection passage 58 may include a first end portion 58-1 and a second end portion 58-2. The first end portion 58-1 is connected to the first end portion 20001 of the cigarette 20000. For example, the first end portion 58-1 of the pressure detection passage 58 may be located close to the first end portion 20001 of the cigarette 20000. The first end portion 58-1 of the pressure detection passage 58 may be in contact with the first end portion 20001 of the cigarette 20000. The inner end portion 57-1 of the mainstream smoke passage 57 may be apart from the first end portion 58-1 of the pressure detection passage 58. The pressure detection passage 58 extends in an extension direction of the mainstream smoke passage 57. The pressure detection passage 58 extends in an extension direction of the cigarette 20000. The pressure detection passage 58 includes a pressure detection hole connected to the pressure detection sensor 60. In the exemplary embodiment illustrated in FIG. 4A, the second end portion 58-2 of the pressure detection passage 58 is an opening connected to the pressure detection sensor 60. Accordingly, in the exemplary embodiment illustrated in FIG. 4A, the second end portion 58-2 of the pressure detection passage 58 functions as the pressure detection hole. In the exemplary embodiment illustrated in FIG. 4A, a through-hole 55-1 for exposing the pressure detection sensor 60 is provided in the protection film 55 that is provided between the pressure detection sensor 60 and an inner wall of the accommodation portion 56 to prevent leakage of air. Also, the pressure detection hole, that is, the second end portion 58-2, is connected to a through-hole 55-1. As such, the pressure detection passage 58 independent of the mainstream smoke passage 57 may be implemented.

When the external air passes through the vaporizer 14000, the aerosol with mainstream smoke is introduced into the mainstream smoke passage 57. The aerosol may be partially liquefied in the mainstream smoke passage 57. According to the present exemplary embodiment, as the pressure detection passage 58 and the mainstream smoke passage 57 are independent of each other, aerosol or liquid from the liquefied aerosol is not introduced into the pressure detection passage 58. Accordingly, malfunction or pressure detection error of the pressure detection sensor 60 due to the aerosol or the liquid from liquefied aerosol may be reduced.

Figure 5:
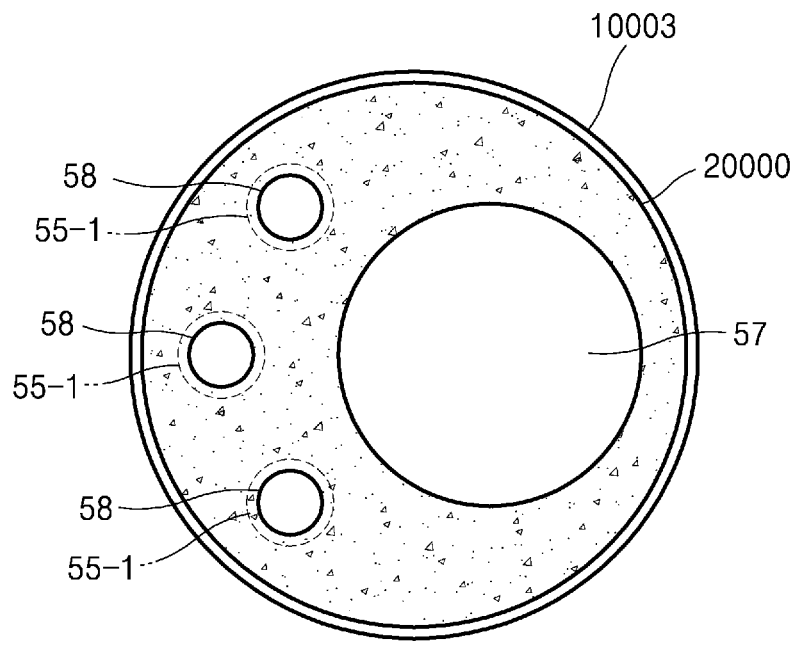
FIGS. 5 and 6 illustrate an example of an arrangement of a mainstream smoke passage and a pressure detection passage.
Figure 6:
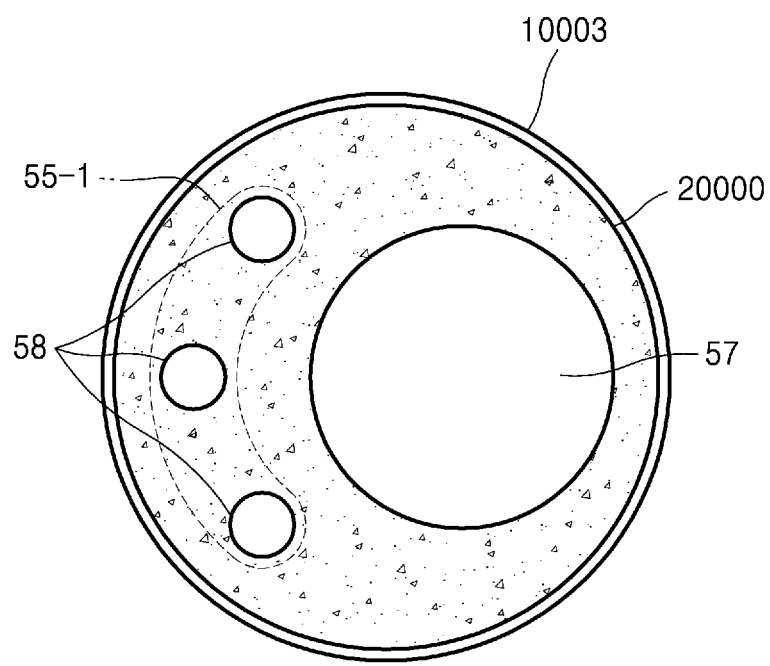

FIGS. 5 and 6 illustrate examples of the arrangement of the mainstream smoke passage 57 and the pressure detection passage 58. Referring to FIGS. 4A, 5, and 6, the cross-section of the mainstream smoke passage 57 may be about 15% to 70% of the cross-section of the cigarette 20000. When the cross-section of the mainstream smoke passage 57 is less by about 15% than the cross-section of the cigarette 20000, excessive inhale resistance is formed so that a sufficient amount of air may not be inhaled. Accordingly, because of the small inhale amount of the aerosol, it may be difficult to provide sufficient flavor to a user, and a the aerosol is likely to be liquefied in the mainstream smoke passage 57. When the cross-section of the mainstream smoke passage 57 is about 15%-70% of the cross-section of the cigarette 20000, a sufficient amount of air and aerosol may be inhaled. Furthermore, when the cross-section of the mainstream smoke passage 57 is about 15%-70% of the cross-section of the cigarette 20000, the liquefaction of the aerosol in the mainstream smoke passage 57 may be reduced.

The first end portion 20001 of the cigarette 20000 is supported by a stopper 54. The maximum cross-section of the stopper 54 to support the cigarette 20000 may be calculated by subtracting the combined cross-section of the mainstream smoke passage 57 and the pressure detection passage 58 from the cross-section of the cigarette 20000. Because the cross-section of the mainstream smoke passage 57 is sufficiently greater than the cross-section of the pressure detection passage 58, the cross-section of the stopper 54 is mostly dependent on the cross-section of the mainstream smoke passage 57. The cross-section of the stopper 54 is set to stably support the first end portion 20001 of the cigarette 20000. When the cross-section of the mainstream smoke passage 57 is greater than about 70% of the cross-section of the cigarette 20000, it is difficult to secure the cross-section of the stopper 54 to stably support the first end portion 20001 of the cigarette 20000. Accordingly, the cross-section of the mainstream smoke passage 57 may be set to be less than or equal to about 70% of the cross-section of the cigarette 20000.

The cross-section of the pressure detection passage 58 is smaller than the cross-section of the mainstream smoke passage 57. According to the configuration, the inhale resistance in the pressure detection passage 58 is greater than the inhale resistance in the mainstream smoke passage 57. As such, the inhale pressure may be precisely measured and, the flow of air and aerosol through the mainstream smoke passage 57 may be smooth.

The first end portion 58-1 of the pressure detection passage 58 is connected to the first end portion 20001 of the cigarette 20000. Accordingly, a constituent material in the cigarette 20000, for example, an aerosol generation material or a receptor receiving the aerosol generation material, may be separated from the cigarette 20000 and block the pressure detection passage 58. Furthermore, the pressure detection passage 58 is likely to be clogged by foreign materials introduced from the outside while the cigarette 20000 is removed from the case 10001.

In order to obtain a good measurement sensitivity of the inhale pressure and prevent clogging of the pressure detection passage 58, the cross-section of the pressure detection passage 58 may be set to be greater than or equal to 2 mm$^2$. Furthermore, by including two or more of the pressure detection passages 58, the inhale pressure may be stably measured and detected even when some of the pressure detection passages 58 are temporarily or permanently clogged. Although FIGS. 5 and 6 illustrate three pressure detection passages 58, as necessary, two or more than four pressure detection passages may be provided as the pressure detection passage 58.

As illustrated in FIG. 5, the protection film 55 may include the through-hole 55-1 corresponding to each of the pressure detection passages 58. Furthermore, as illustrated in FIG. 6, the protection film 55 may include the through-hole 55-1 having a slot shape corresponding to the entire pressure detection passages 58.

Although FIGS. 5 and 6 illustrate that the shape of the cross-sections of the pressure detection passage 58 and the mainstream smoke passage 57 is circular, the shape of the cross-sections of the pressure detection passage 58 and the mainstream smoke passage 57 does not need to be circular.

Figure 4B:
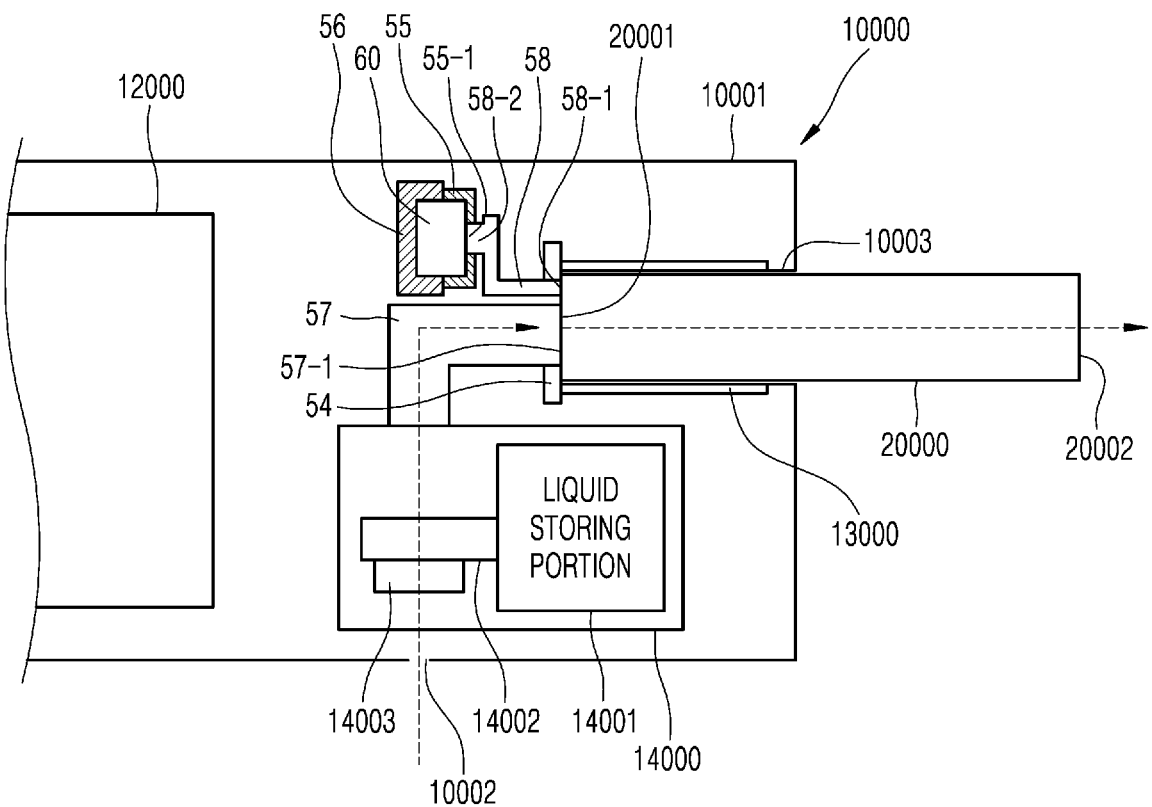

As illustrated in FIG. 4B, the structures of the pressure detection passage 58 and the mainstream smoke passage 57 and the arrangement structure of the pressure detection sensor 60 illustrated in FIGS. 4A, 5, and 6 may be applied to the aerosol generation device 10000 illustrated in FIG. 2.

Figure 7A:
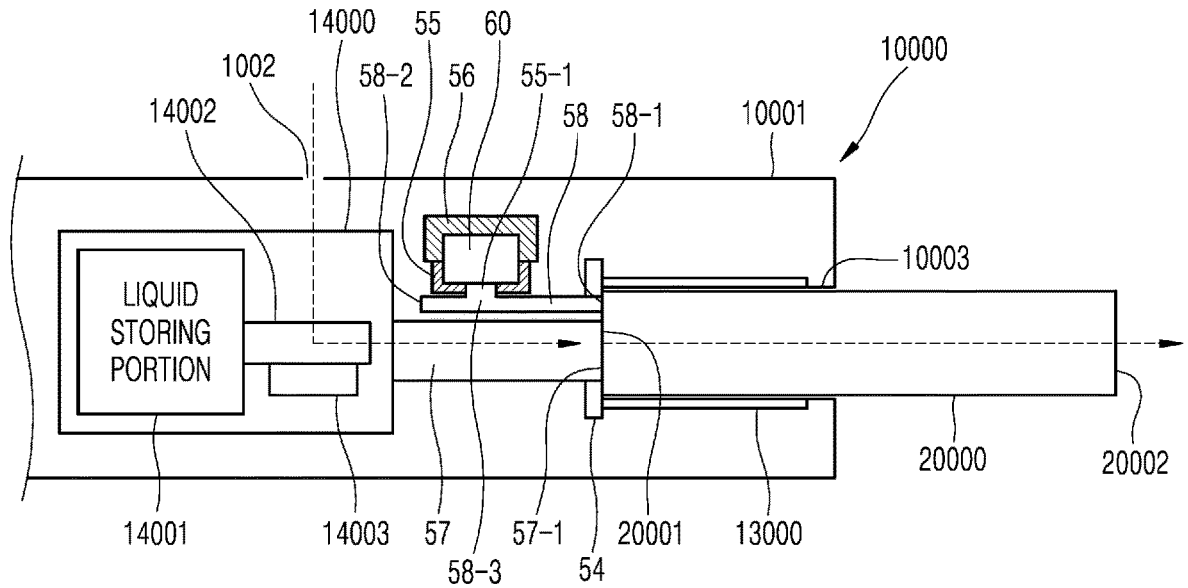
FIGS. 7A and 7B are schematic diagrams of an exemplary embodiment of an aerosol generation device.

The arrangement form of the pressure detection passage 58 and the pressure detection sensor 60 may vary. FIG. 7A is a schematic diagram of an exemplary embodiment of the aerosol generation device 10000. Referring to FIG. 7A, the first end portion 58-1 of the pressure detection passage 58 is connected to the first end portion 20001 of the cigarette 20000. The pressure detection passage 58 extends in the extension direction of the mainstream smoke passage 57. The pressure detection passage 58 extends in the extension direction of the cigarette 20000. The second end portion 58-2 of the pressure detection passage 58 is a closed end portion. A pressure detection hole 58-3 is provided between the first end portion 58-1 and the second end portion 58-2. The pressure detection hole 58-3 is connected to the pressure detection sensor 60. In the exemplary embodiment illustrated in FIG. 7A, the through-hole 55-1 for exposing the pressure detection sensor 60 is provided in the protection film 55 that is provided between the pressure detection sensor 60 and the inner wall of the accommodation portion 56 to prevent the leakage of air, and the pressure detection hole 58-3 is connected to the through-hole 55-1.

According to the configuration, even when foreign materials or liquid is introduced into the pressure detection passage 58, the foreign materials or liquid flows toward the second end portion 58-2. As such, malfunction or pressure detection error of the pressure detection sensor 60 due to the foreign materials or liquid may be reduced.

MODE OF DISCLOSURE

Figure 7B:
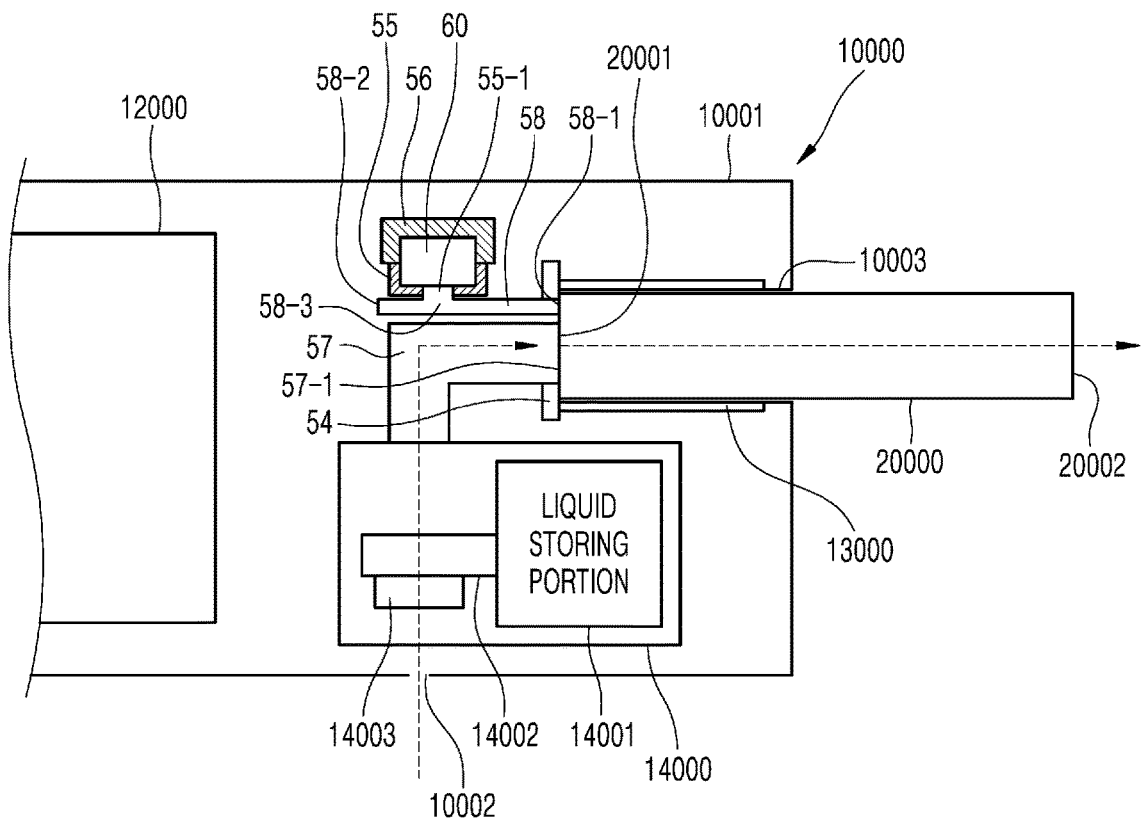

As illustrated in FIG. 7B, the structures of the pressure detection passage 58 and the mainstream smoke passage 57 and the arrangement structure of the pressure detection sensor 60 illustrated in FIG. 7A may be applied to the aerosol generation device 10000 illustrated in FIG. 2.

Figure 8A:
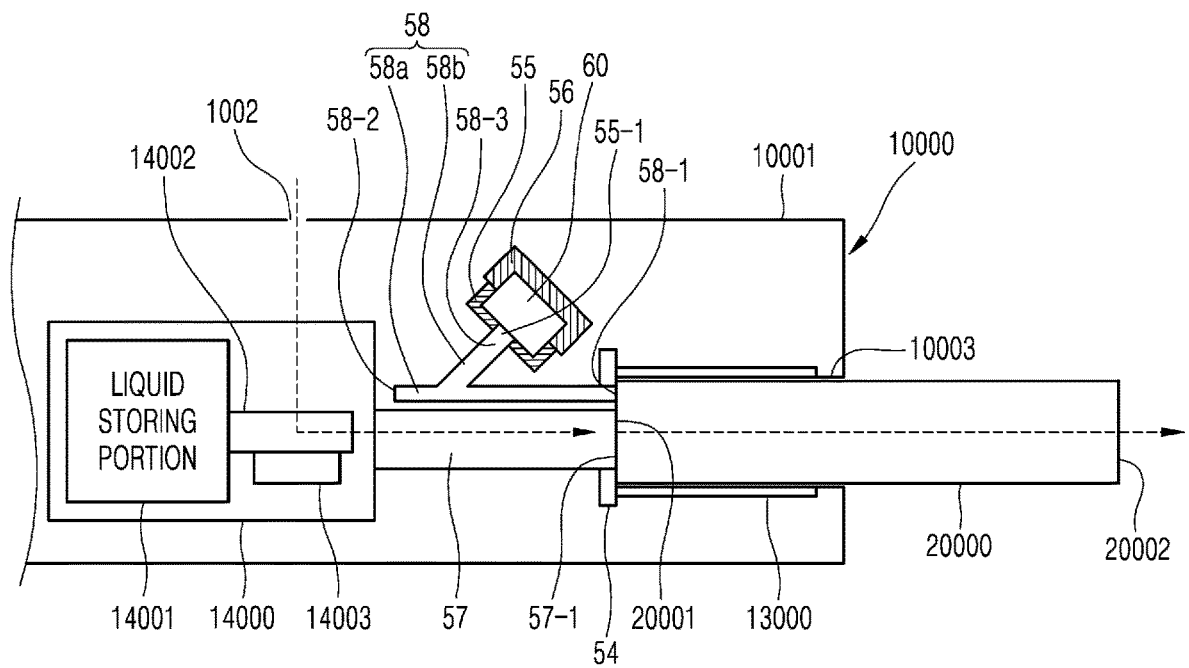
FIGS. 8A and 8B are schematic diagrams of an exemplary embodiment of an aerosol generation device.

FIG. 8A is a schematic diagram of an exemplary embodiment of the aerosol generation device 10000. Referring to FIG. 8A, the pressure detection passage 58 includes a main passage 58a and a branch passage 58b. The first end portion 58-1 of the main passage 58a is connected to the first end portion 20001 of the cigarette 20000. The main passage 58a extends in the extension direction of the mainstream smoke passage 57. The main passage 58a extends in the extension direction of the cigarette 20000. The second end portion 58-2 of the main passage 58a is a closed end portion. The branch passage 58b is branched between the first end portion 58-1 and the second end portion 58-2. The branch passage 58B obliquely extends toward the first end portion 20001 of the cigarette 20000. The pressure detection hole 58-3 is provided at an end portion of a branch passage 58b. The pressure detection hole 58-3 is connected to the pressure detection sensor 60. In the exemplary embodiment illustrated in FIG. 8A, the through-hole 55-1 for exposing the pressure detection sensor 60 is provided in the protection film 55 that is provided between the pressure detection sensor 60 and the inner wall of the accommodation portion 56 to prevent the leakage of air, and the pressure detection hole 58-3 is connected to the through-hole 55-1.

According to the configuration, even when foreign materials or liquid is introduced into the main passage 58a, the foreign materials or liquid flows toward the second end portion 58-2. As such, malfunction or pressure detection error of the pressure detection sensor 60 due to the foreign materials or liquid may be reduced. As the pressure detection sensor 60 is spaced apart from the main passage 58a by the branch passage 58b, contamination of the pressure detection sensor 60 due to foreign materials or liquid may be further reduced. The aerosol generation device 10000 is generally used while the cigarette 20000 stands upright. In a normal use state of the aerosol generation device 10000, in order for the foreign materials or liquid to reach the pressure detection sensor 60, the foreign materials or liquid have to move against gravity along the branch passage 58b. Accordingly, in the case where the branch passage 58b obliquely extends toward the first end portion 20001 of the cigarette 20000, a possibility that the pressure detection sensor 60 is contaminated due to the foreign materials or liquid may be further reduced.

Figure 8B:
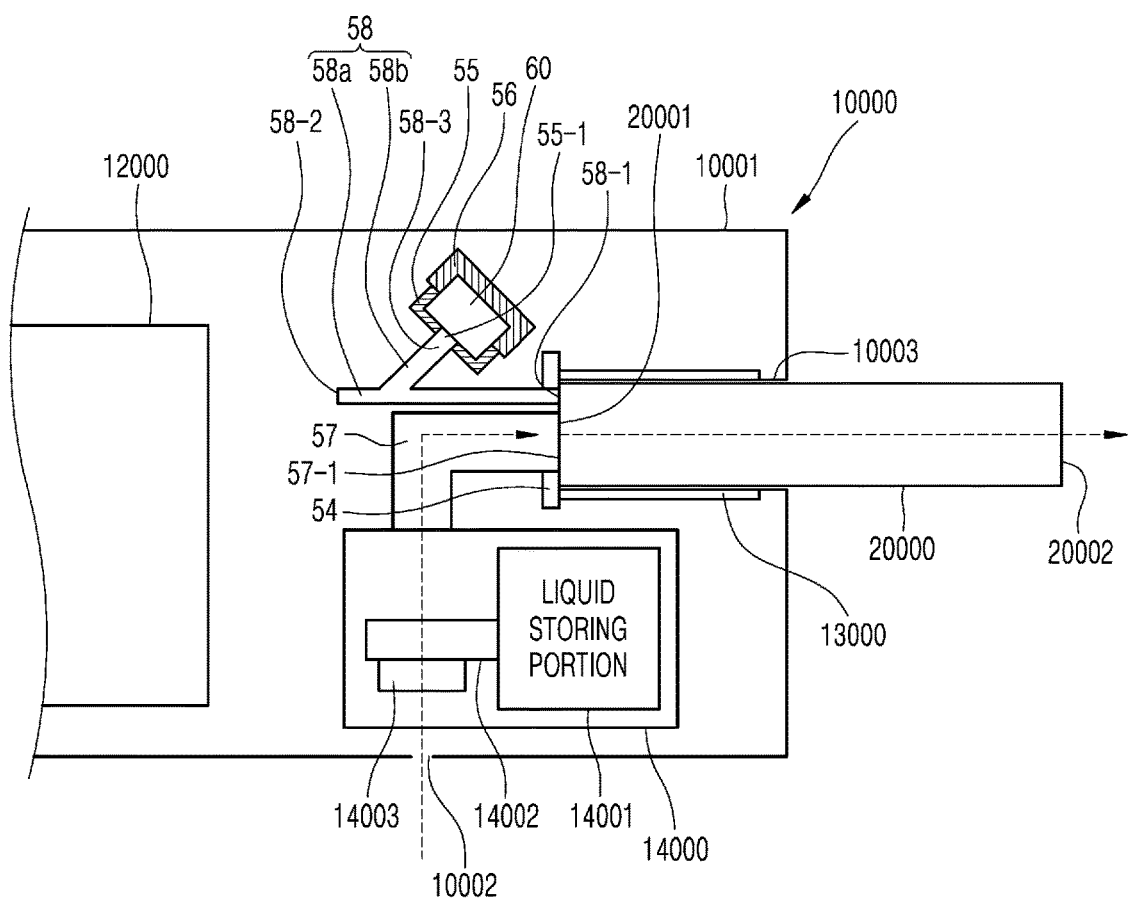

As illustrated in FIG. 8B, the structures of the pressure detection passage 58 and the mainstream smoke passage 57 and the arrangement structure of the pressure detection sensor 60 illustrated in FIG. 8A may be applied to the aerosol generation device 10000 illustrated in FIG. 2.

In the above-described exemplary embodiments, the pressure detection sensor 60 is located at the upstream side of the first end portion 20001 of the cigarette 20000 with respect to an air flow direction in the case 10001. The pressure detection sensor 60 may be located at the downstream side of the first end portion 20001 of the cigarette 2000.

Figure 9A:
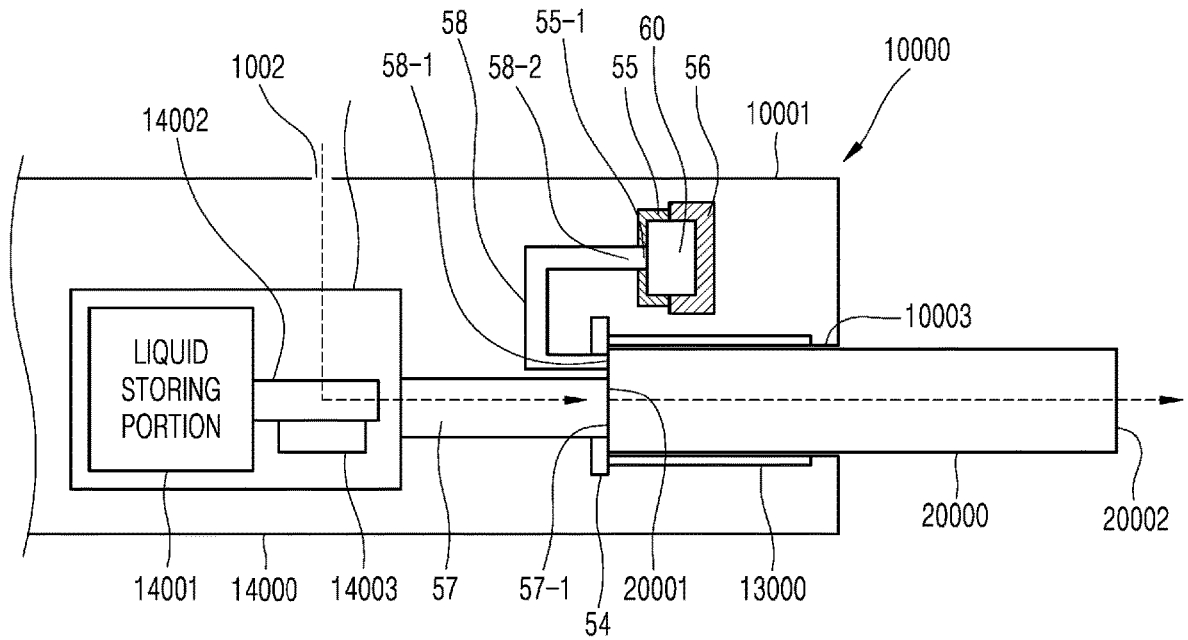
FIGS. 9A and 9B are schematic diagrams of an exemplary embodiment of an aerosol generation device.

FIG. 9A is a schematic diagram of an exemplary embodiment of the aerosol generation device 10000. Referring to FIG. 9A, the first end portion 58-1 of the pressure detection passage 58 is connected to the first end portion 20001 of the cigarette 20000. The pressure detection passage 58 has a "U" shape in a lengthwise direction of the cigarette 20000. In other words, the pressure detection passage 58 extends from the first end portion 20001 of the cigarette 20000 toward the upstream side of the cigarette 20000 and extends toward the downstream side by changing the direction. The second end portion 58-2 of the pressure detection passage 58 is located at the downstream side of the first end portion 20001 of the cigarette 20000 and is an open end portion. Accordingly, the second end portion 58-2 functions as the pressure detection hole. The second end portion 58-2 is connected to the pressure detection sensor 60. In the exemplary embodiment illustrated in FIG. 9A, the through-hole 55-1 for exposing the pressure detection sensor 60 is provided in the protection film 55 that is provided between the pressure detection sensor 60 and the inner wall of the accommodation portion 56 to prevent the leakage of air, and the second end portion 58-2 is connected to the through-hole 55-1.

According to the configuration, the aerosol generation device 10000 is used in a situation where the cigarette 20000 stands upright. In the normal use state of the aerosol generation device 10000, for the foreign materials or liquid to reach the pressure detection sensor 60, the foreign materials or liquid have to move against gravity along the pressure detection passage 58. Accordingly, a possibility that the pressure detection sensor 60 is contaminated due to the foreign materials or liquid may be further reduced.

Figure 9B:
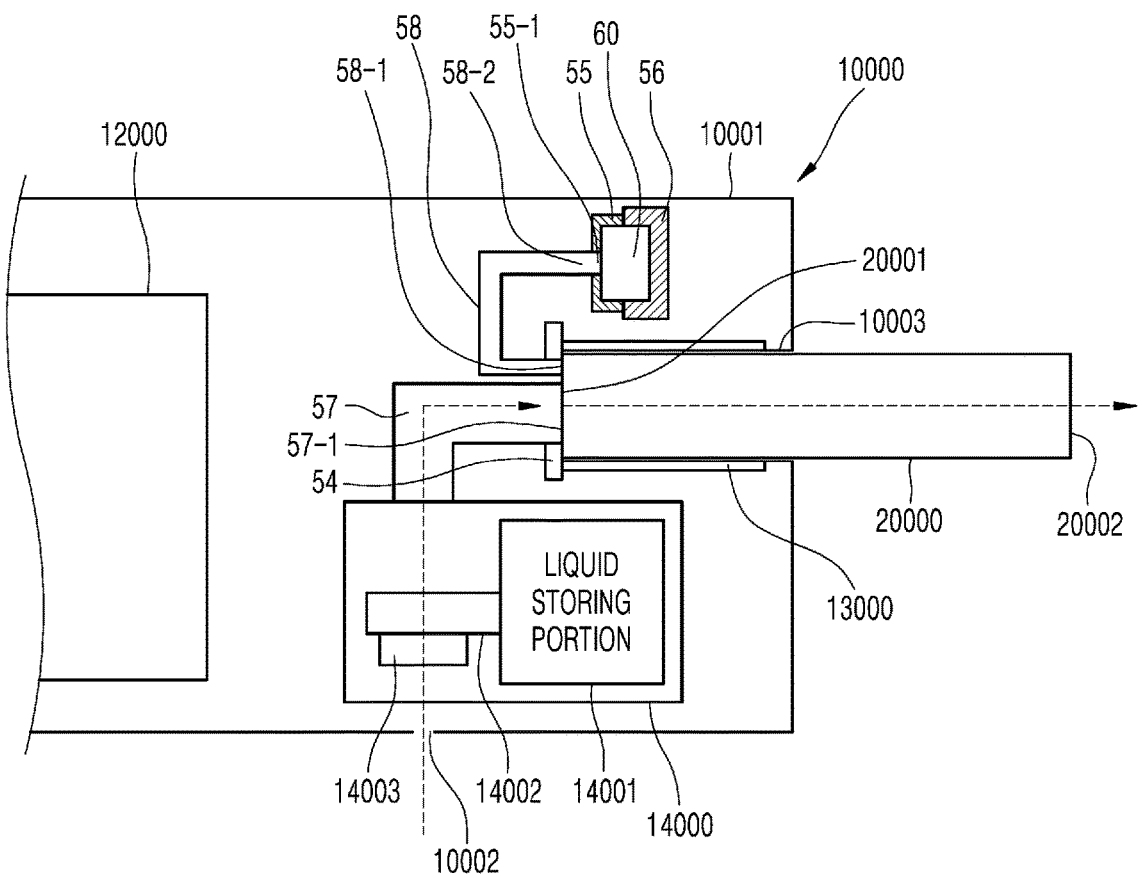

As illustrated in FIG. 9B, the structures of the pressure detection passage 58 and the mainstream smoke passage 57 and the arrangement structure of the pressure detection sensor 60 illustrated in FIG. 9A may be applied to the aerosol generation device 10000 illustrated in FIG. 2.

Figure 10:
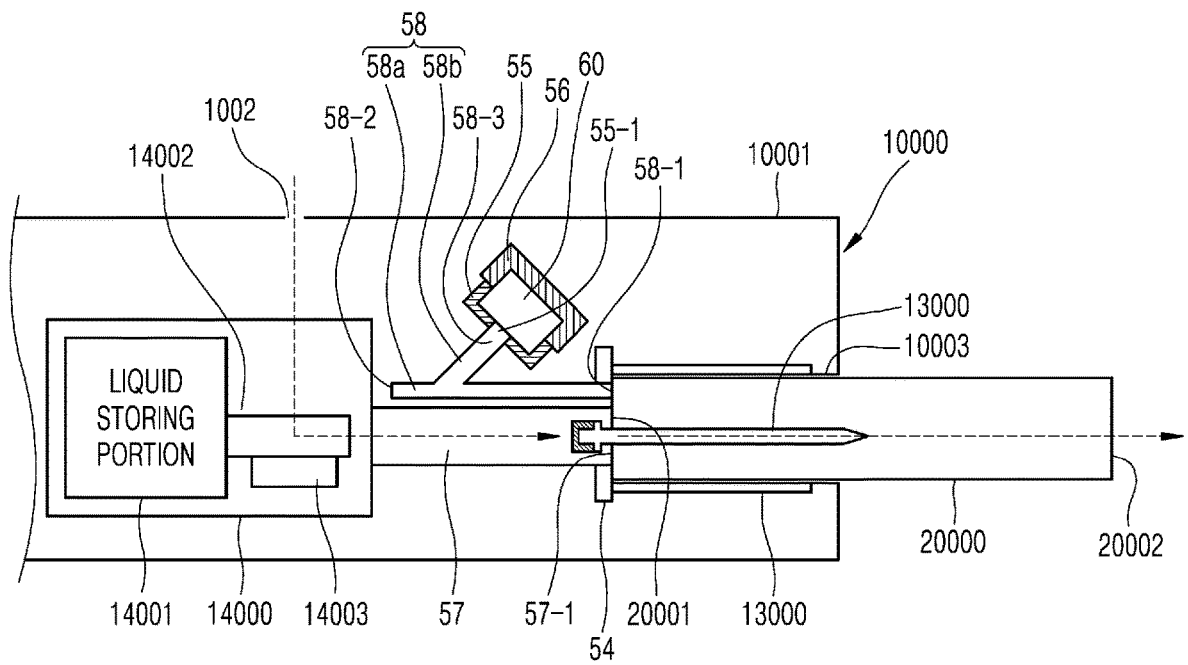
FIG. 10 is a schematic diagram of an exemplary embodiment of an aerosol generation device.
Figure 11:
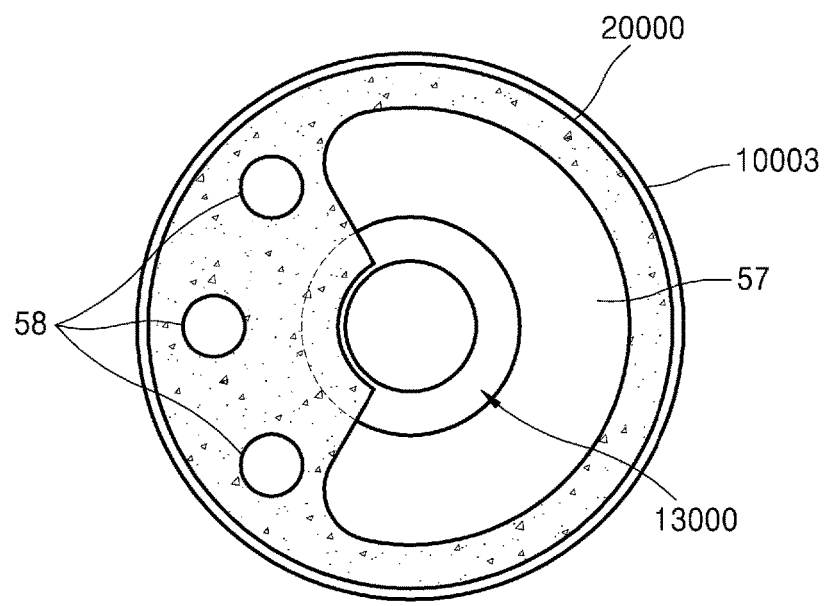
FIGS. 11, 12, and 13 illustrate examples of an arrangement of a mainstream smoke passage and a pressure detection passage.
Figure 12:
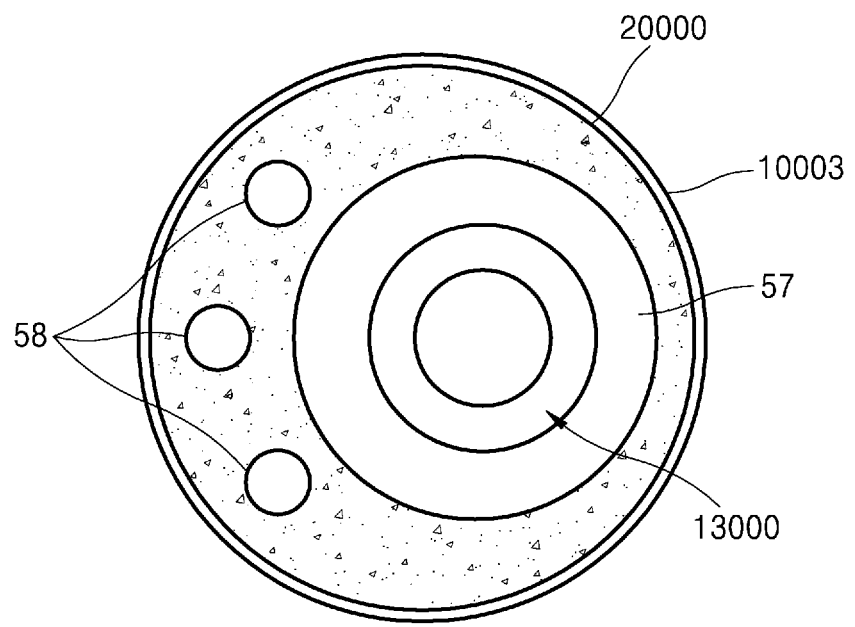
Figure 13:
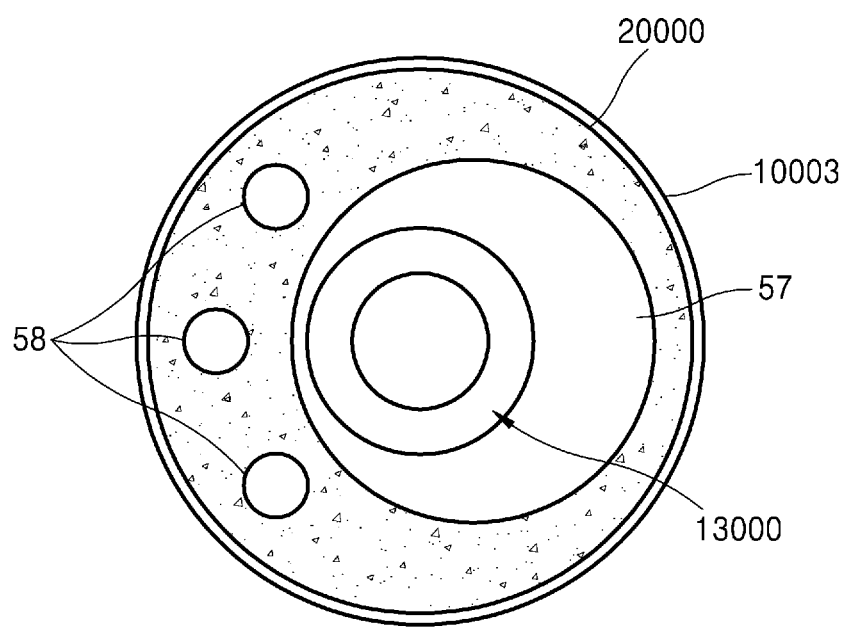

The heater 13000 may be inserted into the cigarette 20000 through the end portion of the cigarette 20000. FIG. 10 is a schematic diagram of an exemplary embodiment of the aerosol generation device 10000. FIGS. 11, 12, and 13 illustrate examples of the arrangement of the mainstream smoke passage 57 and the pressure detection passage 58.

Referring to FIGS. 10, 11, 12, and 13, the heater 13000 for heating the cigarette 20000 has a needle shape and may be inserted into the first end portion 20001 of the cigarette 20000. The structures of the pressure detection passage 58 and the mainstream smoke passage 57 according to the present exemplary embodiment are similar to the shape of the structure illustrated in FIG. 8A. The pressure detection passage 58 is formed independently of the mainstream smoke passage 57, and connects the first end portion 20001 of the cigarette 20000 to the pressure detection sensor 60.

The arrangements of the heater 13000 and the mainstream smoke passage 57 may vary. The mainstream smoke passage 57 may at least partially surround the heater 13000. According to the above configuration, the heater 13000 may be located at the center portion of the cigarette 20000 or at a position close to the center portion thereof, and thus, the cross-section of the mainstream smoke passage 57 may be obtained as large as possible.

For example, referring to FIG. 11, the heater 13000 may be located at the center portion of the cigarette 20000. The mainstream smoke passage 57 may partially surround the heater 13000. The pressure detection passage 58 may be separated from the mainstream smoke passage 57.

For example, referring to FIG. 12, the heater 13000 may be located at a position deviated to one side from the center portion of the cigarette 20000. The mainstream smoke passage 57 may entirely surround the heater 13000. The pressure detection passage 58 may be separated from the mainstream smoke passage 57.

Referring to FIG. 13, the heater 13000 may be located at the center portion of the cigarette 20000. The mainstream smoke passage 57 may entirely surround the heater 13000. The pressure detection passage 58 may be separated from the mainstream smoke passage 57.

The structure of the aerosol generation device 10000 illustrated in FIGS. 10 to 13 may be applied to the aerosol generation device 10000 illustrated in FIGS. 2, 4A, 4B, 7A, 7B, 8A, 8B, 9A, and 9B.

The exemplary embodiments of the above-described structures in which the pressure detection passage 58 is separated from the mainstream smoke passage 57 may be applied to a non-combustible type smoking device in which the vaporizer 14000 is not employed and the mainstream smoke passage 57 is directly connected to the outside. Because the pressure detection passage 58 is independent of the mainstream smoke passage 57, the measured pressure may be less affected by the mainstream smoke pressure. Accordingly, measurement sensitivity of the inhale pressure generated by a puff may be improved, and the inhale pressure may be precisely measured.

Figure 14:
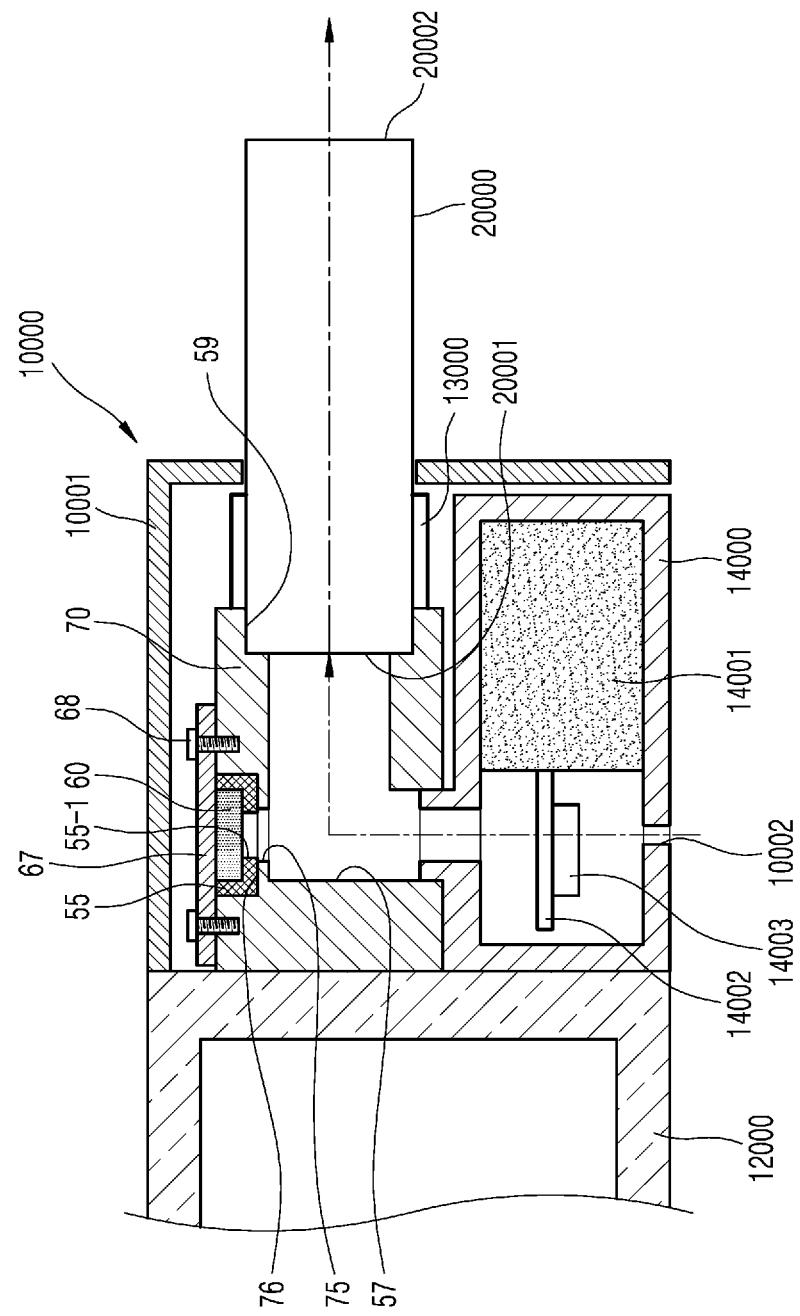
FIG. 14 is a cross-sectional view of an aerosol generation device according to another exemplary embodiment.
Figure 15:
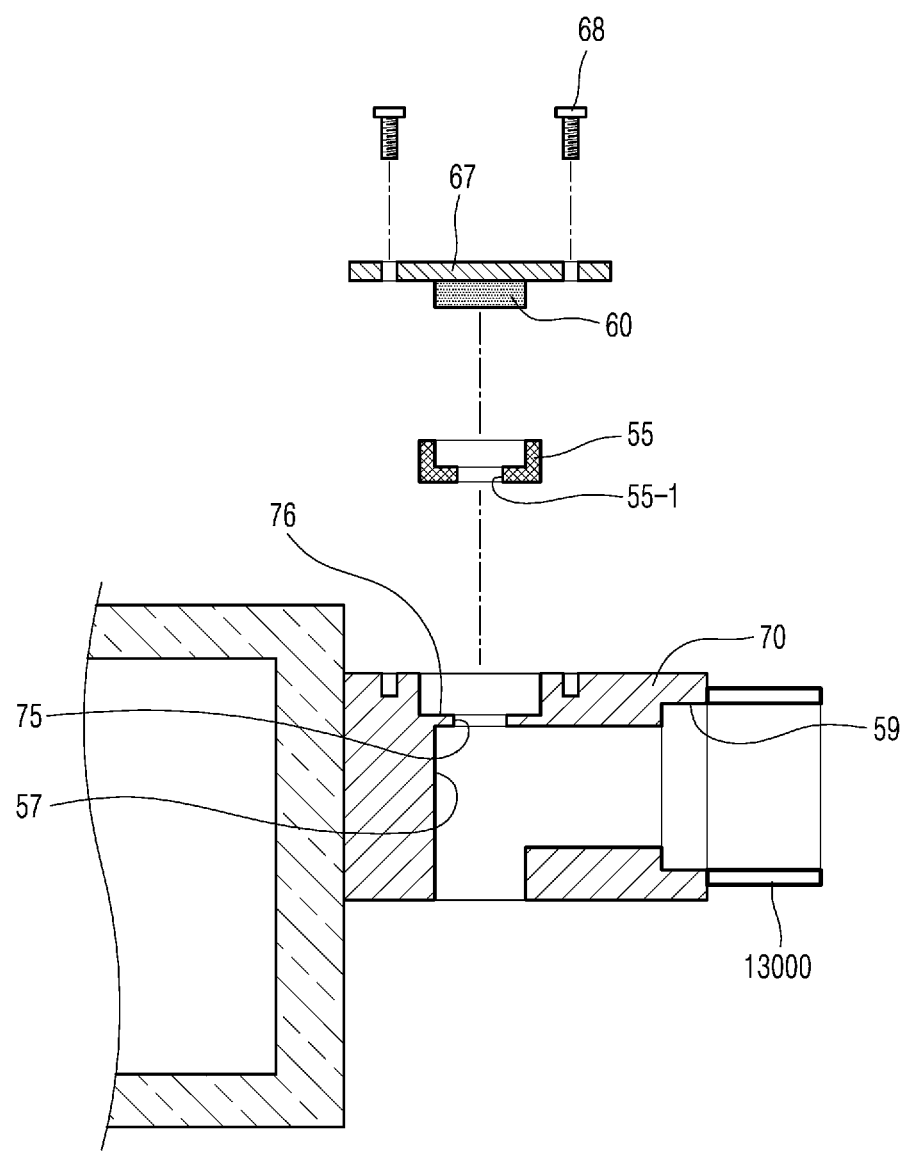
FIG. 15 is a schematic exploded view of a coupling relationship of some constituent elements of the aerosol generation device of FIG. 14.

FIG. 14 is a cross-sectional view of an aerosol generation device according to another exemplary embodiment. FIG. 15 is a schematic exploded view of a coupling relationship of some constituent elements of the aerosol generation device of FIG. 14.

The aerosol generation device 10000 according to the exemplary embodiment illustrated in FIGS. 14 and 15 includes the case 10001 forming appearance and into which the cigarette 20000 may be inserted, the heater 13000 disposed in the case 10001 and heating the cigarette 20000 inserted into the case 10001, the mainstream smoke passage 57 connecting the first end portion 20001 of the cigarette 20000 to the outside, and the pressure detection sensor 60 detecting a change in the pressure of air inhaled to pass through the cigarette 20000.

A cigarette support portion 70 for supporting the first end portion 20001 of the cigarette 20000 is disposed in the case 10001. The cigarette support portion 70 includes a cigarette support hole 59 into which the first end portion 20001 of the cigarette 20000 is inserted. The cigarette support portion 70 includes the mainstream smoke passage 57 formed therein to penetrate the same. The cigarette support portion 70 includes a pressure detection hole 75 that exposes part of the mainstream smoke passage 57 to the outside of the cigarette support portion 70. The pressure detection sensor 60 is disposed in the pressure detection hole 75.

In the aerosol generation device 10000 according to the present exemplary embodiment, the aerosol generated by the vaporizer 14000 is transferred to a user by passing through the cigarette 20000. The vaporizer 14000 and the cigarette 20000 are connected to each other by the mainstream smoke passage 57. Reference numerals 14001, 14002, and 14003 denote a liquid storing portion, a liquid transfer device, and a heating element for heating a liquid, respectively. The liquid storing portion 14001 may be in the form of an individually replaceable cartridge. The liquid storing portion 14001 may have a structure to refill the liquid. The vaporizer 14000 may be in the form of an entirely replaceable cartridge.

The mainstream smoke passage 57 connects the first end portion 20001 of the cigarette 20000 to the outside so that the external air may be introduced into the cigarette 20000 by a user inhaling the cigarette 20000 in the mouth (puff motion). The external air is inhaled into the case 10001 through the air vent 10002 provided in the vaporizer 14000. The air passes through the vaporizer 14000. The air passed through vaporizer 14000 includes aerosol that is generated as the liquid is vaporized. The air passed through vaporizer 14000 is introduced into the first end portion 20001 of the cigarette 20000 through the mainstream smoke passage 57. The first end portion 20001 of the cigarette 20000 is an end portion located in the case 10001. The air passes through the cigarette 20000 to be inhaled by a smoker through the second end portion 20002.

The pressure detection sensor 60 is mounted on a circuit substrate 67 that is disposed outside the cigarette support portion 70. The circuit substrate 67 includes a printed circuit board formed of a rigid material or a soft material, and may perform functions to supply electricity to the pressure detection sensor 60 and transmit a detection signal generated by the pressure detection sensor 60 to the controller 12000.

When the circuit substrate 67 is coupled to the outside of the cigarette support portion 70 by using a bolt 68, the pressure detection sensor 60 mounted on the circuit substrate 67 is disposed in the pressure detection hole 75, and thus, the pressure detection sensor 60 is exposed to the inside of the mainstream smoke passage 57.

The protection film 55 is disposed between the pressure detection sensor 60 and the pressure detection hole 75. The protection film 55 includes the through-hole 55-1 through which the pressure detection sensor 60 is exposed to the mainstream smoke passage 57. As the cigarette support portion 70 extends along an edge of the pressure detection hole 75, the cigarette support portion 70 includes a step 76 for supporting the protection film 55.

The protection film 55 is manufactured of an elastic material such as rubber, flexible plastic, or sponge, and performs functions to protect the pressure detection sensor 60 by surrounding at least part of the pressure detection sensor 60. Also, the protection film 55 hermetically seals a connection portion between the pressure detection sensor 60 and the mainstream smoke passage 57 to prevent leakage of air or liquid through the connection portion.

As the protection film 55 has elasticity, when the circuit substrate 67 is coupled to the cigarette support portion 70 by using the bolt 68 and the circuit substrate 67 presses against the cigarette support portion 70, the protection film 55 is pressed and deformed so that the connection portion between the pressure detection sensor 60 and the pressure detection hole 75 may be hermetically sealed.

As described above, as the pressure detection sensor 60 is disposed in the pressure detection hole 75 that exposes part of the mainstream smoke passage 57 to the outside of the cigarette support portion 70, the inhale pressure that is a pressure of the air generated by a puff of the user inhaling the cigarette 20000 in the mouth may be detected.

Due to the structure of the pressure detection sensor 60 being directly connected to the mainstream smoke passage 57, the pressure detection sensor 60 may precisely detect a change in the pressure of air passing through the mainstream smoke passage 57. As a result, an error of the detection operation may be reduced.

Furthermore, due to the structure in which the pressure detection sensor 60 is directly connected to the mainstream smoke passage 57, a phenomenon that a liquid is accumulated in a portion where the pressure detection sensor 60 is disposed may be reduced.

Furthermore, as the pressure detection sensor 60 is directly exposed to the mainstream smoke passage 57 through the pressure detection hole 75, cleaning may be conveniently performed by easily accessing the pressure detection sensor 60. If the vaporizer 14000 is manufactured in the form of a replaceable cartridge, the mainstream smoke passage 57 may be cleaned by separating the vaporizer 14000 from the case 10001. As the pressure detection sensor 60 that is directly exposed to the mainstream smoke passage 57 may be easily accessed, cleaning may be conveniently performed.

Those skilled in the art will appreciate that the present disclosure may be embodied in a modified form without departing from the essential characteristics of the above-described disclosure. Therefore, the disclosed methods should be considered in a descriptive sense, not in a limitation sense. The scope of the present disclosure is shown not in the foregoing description but in the claims below, and all differences within the scope equivalent thereto should be construed as being included in the present disclosure.

INDUSTRIAL APPLICABILITY

The exemplary embodiments relate to an aerosol generation device that replaces a combustion-type cigarette.

What is claimed is:
1. An aerosol generation device comprising:
a case into which a cigarette is to be inserted;
a heater disposed in the case and configured to heat the cigarette inserted into the case;
a mainstream smoke passage connecting an end portion of the cigarette to outside the case;

a pressure detection sensor configured to detect a change in a pressure of air inhaled to pass through the cigarette; and at least one pressure detection passage that connects the end portion of the cigarette to the pressure detection sensor, and is formed independently of the mainstream smoke passage, wherein an accommodation portion for accommodating the pressure detection sensor is provided in the case, and a protection film for preventing leakage of air is provided between the accommodation portion and the pressure detection sensor.

2. The aerosol generation device of claim 1, wherein a cross-section of the mainstream smoke passage is equal to or greater than 15% of a cross-section of the cigarette.

3. The aerosol generation device of claim 2, wherein the cross-section of the mainstream smoke passage is equal to or less than 70% of the cross-section of the cigarette.

4. The aerosol generation device of claim 1, wherein the at least one pressure detection passage comprises two or more pressure detection passages.

5. The aerosol generation device of claim 1, wherein a cross-section of the pressure detection passage is equal to or greater than 2 mm$^2$ and smaller than a cross-section of the mainstream smoke passage.

6. The aerosol generation device of claim 4, wherein
two or more through-holes through which the pressure detection sensor is exposed and respectively connected to the two or more pressure detection passages provided in the protection film.

7. The aerosol generation device of claim 1, wherein the pressure detection sensor is located at an upstream side with respect to the end portion of the cigarette.

8. The aerosol generation device of claim 1, wherein the pressure detection sensor is located at a downstream side with respect to the end portion of the cigarette.

9. The aerosol generation device of claim 1, wherein
the pressure detection passage extends in an extension direction of the cigarette,
a first end portion of the pressure detection passage is connected to the end portion of the cigarette, and
a second end portion of the pressure detection passage, which is opposite to the first end portion, includes an opening connected to the pressure detection sensor.

10. The aerosol generation device of claim 1, wherein the pressure detection passage has a "U" shape in a lengthwise direction of the cigarette.

11. The aerosol generation device of claim 1, wherein the heater surrounds an outer circumference of the cigarette.

12. The aerosol generation device of claim 1, wherein the heater is inserted into the cigarette through the end portion of the cigarette.

13. The aerosol generation device of claim 12, wherein the mainstream smoke passage surrounds at least part of the heater.

14. An aerosol generation device comprising:
a case into which a cigarette is to be inserted;
a heater disposed in the case and configured to heat the cigarette inserted into the case;
a mainstream smoke passage connecting an end portion of the cigarette to outside the case;
a pressure detection sensor configured to detect a change in a pressure of air inhaled to pass through the cigarette; and at least one pressure detection passage that connects the end portion of the cigarette to the pressure detection sensor, and is formed independently of the mainstream smoke passage, wherein an accommodation portion for accommodating the pressure detection sensor is provided in the case,
a protection film for preventing leakage of air is provided between the accommodation portion and the pressure detection sensor, and
a through-hole through which the pressure detection sensor is exposed and connected to the pressure detection passage provided in the protection film.

15. An aerosol generation device comprising:
a case into which a cigarette is to be inserted;
a heater disposed in the case and configured to heat the cigarette inserted into the case;
a mainstream smoke passage connecting an end portion of the cigarette to outside the case;
a pressure detection sensor configured to detect a change in a pressure of air inhaled to pass through the cigarette; and at least one pressure detection passage that connects the end portion of the cigarette to the pressure detection sensor, and is formed independently of the mainstream smoke passage, wherein the pressure detection passage extends in an extension direction of the cigarette,
a first end portion of the pressure detection passage is connected to the end portion of the cigarette,
a second end portion of the pressure detection passage that is opposite to the first end portion is closed, and
a pressure detection hole connected to the pressure detection sensor is provided between the first end portion and the second end portion.

16. An aerosol generation device comprising:
a case into which a cigarette is to be inserted;
a heater disposed in the case and configured to heat the cigarette inserted into the case;
a mainstream smoke passage connecting an end portion of the cigarette to outside the case;
a pressure detection sensor configured to detect a change in a pressure of air inhaled to pass through the cigarette; and at least one pressure detection passage that connects the end portion of the cigarette to the pressure detection sensor, and is formed independently of the mainstream smoke passage, wherein the pressure detection passage comprises:
a main passage extending in an extension direction of the cigarette; and
a branch passage branched from the main passage and having, at an end portion thereof, a pressure detection hole connected to the pressure detection sensor.

17. The aerosol generation device of claim 16, wherein the branch passage obliquely extends toward the end portion of the cigarette.

18. An aerosol generation device comprising:
a case into which a cigarette is to be inserted;
a heater disposed in the case and configured to heat the cigarette inserted into the case;
a mainstream smoke passage connecting an end portion of the cigarette to outside the case;
a pressure detection sensor configured to detect a change in a pressure of air inhaled to pass through the cigarette; and a vaporizer configured to generate aerosol from a liquid and transfer the generated aerosol toward the cigarette via the mainstream smoke passage.

19. An aerosol generation device comprising:
a case into which a cigarette is to be inserted;
a heater disposed in the case and configured to heat the cigarette inserted into the case;
a mainstream smoke passage connecting an end portion of the cigarette to outside the case;
a pressure detection sensor configured to detect a change in a pressure of air inhaled to pass through the cigarette; and
a cigarette support portion supporting the end portion of the cigarette,
wherein the mainstream smoke passage is formed to penetrate the cigarette support portion,
wherein the cigarette support portion comprises a pressure detection hole through which part of the mainstream smoke passage is exposed, and
wherein the pressure detection sensor is disposed in the pressure detection hole.

20. The aerosol generation device of claim 19, further comprising a circuit substrate disposed outside of the cigarette support portion,
wherein the pressure detection sensor is mounted on the circuit substrate.

21. The aerosol generation device of claim 20, further comprising a protection film disposed between the pressure detection sensor and the pressure detection hole to surround at least part of the pressure detection sensor.

22. The aerosol generation device of claim 21, wherein the protection film has elasticity, and when the circuit substrate is coupled to the cigarette support portion, the protection film is pressed against the cigarette support portion and is deformed.

23. The aerosol generation device of claim 22, wherein the cigarette support portion comprises a step formed at an edge of the pressure detection hole to support the protection film.

* * * * *